US008383439B2

(12) United States Patent
Yokoyama et al.

(10) Patent No.: US 8,383,439 B2
(45) Date of Patent: Feb. 26, 2013

(54) APPARATUS FOR MANUFACTURING GROUP-III NITRIDE SEMICONDUCTOR LAYER, METHOD OF MANUFACTURING GROUP-III NITRIDE SEMICONDUCTOR LAYER, GROUP-III NITRIDE SEMICONDUCTOR LIGHT-EMITTING DEVICE, METHOD OF MANUFACTURING GROUP-III NITRIDE SEMICONDUCTOR LIGHT-EMITTING DEVICE, AND LAMP

(75) Inventors: Yasunori Yokoyama, Ichihara (JP); Takehiko Okabe, Ichihara (JP); Hisayuki Miki, Chiba (JP)

(73) Assignee: Showa Denko K.K., Tokyo (JP)

( * ) Notice: Subject to any disclaimer, the term of this patent is extended or adjusted under 35 U.S.C. 154(b) by 531 days.

(21) Appl. No.: 12/257,065

(22) Filed: Oct. 23, 2008

(65) Prior Publication Data
US 2009/0114942 A1 May 7, 2009

Related U.S. Application Data

(60) Provisional application No. 60/988,245, filed on Nov. 15, 2007.

(30) Foreign Application Priority Data

Oct. 25, 2007 (JP) ................. 2007-277927
Jul. 15, 2008 (JP) ................. 2008-184027

(51) Int. Cl.
*H01L 21/20* (2006.01)

(52) U.S. Cl. ............ 438/46; 257/E21.097; 257/E21.108
(58) Field of Classification Search .................. 438/46; 257/E21.097, E21.108
See application file for complete search history.

(56) References Cited

U.S. PATENT DOCUMENTS

| 5,909,036 A * | 6/1999 | Tanaka et al. ............. 257/94 |
| 6,200,893 B1 * | 3/2001 | Sneh ........................ 438/685 |
| 6,312,568 B2 * | 11/2001 | Wilke et al. .............. 204/192.18 |
| 2006/0024451 A1 * | 2/2006 | Mungkekar et al. ........ 427/569 |

OTHER PUBLICATIONS

Y. Ushiku et al., "the 2nd of the 21st century alliance symposium memoirs", 2003, pp. 295-298.

* cited by examiner

*Primary Examiner* — Wensing Kuo
(74) *Attorney, Agent, or Firm* — Sughrue Mion, PLLC

(57) ABSTRACT

The present invention provides an apparatus for manufacturing a group-III nitride semiconductor layer having high crystallinity. An embodiment of the present invention provides an apparatus for manufacturing a group-III nitride semiconductor layer on a substrate 11 using a sputtering method. The apparatus includes: a chamber 41; a target 47 that is arranged in the chamber 41 and includes a group-III element; a first plasma generating means 51 that generates a first plasma for sputtering the target 47 to supply raw material particles to the substrate 11; a second plasma generating means 52 that generates a second plasma including a nitrogen element; and a control means that controls the first plasma generating means 51 and the second plasma generating means 52 to alternately generate the first plasma and the second plasma in the chamber 41.

12 Claims, 7 Drawing Sheets

APPARATUS FOR MANUFACTURING GROUP-III NITRIDE SEMICONDUCTOR LAYER, METHOD OF MANUFACTURING GROUP-III NITRIDE SEMICONDUCTOR LAYER, GROUP-III NITRIDE SEMICONDUCTOR LIGHT-EMITTING DEVICE, METHOD OF MANUFACTURING GROUP-III NITRIDE SEMICONDUCTOR LIGHT-EMITTING DEVICE, AND LAMP

Priority is claimed on Japanese Patent Application No. 2007-277927, filed Oct. 25, 2007, U.S. Provisional Application No. 60/988,245 filed Nov. 15, 2007, and Japanese Patent Application No. 2008-184027, filed Jul. 15, 2008, the contents of all of which are incorporated herein by reference.

TECHNICAL FIELD

The present invention relates to an apparatus for manufacturing a group-III nitride semiconductor layer, a method of manufacturing a group-III nitride semiconductor layer, a group-III nitride semiconductor light-emitting device, a method of manufacturing a group-III nitride semiconductor light-emitting device, and a lamp, and more particularly, to an apparatus and method of manufacturing a group-III nitride semiconductor layer having high crystallinity.

BACKGROUND ART

Apparatuses and methods of manufacturing a group-III nitride semiconductor layer made of, for example, a nitride compound semiconductor crystal using a reactive sputtering method have been proposed.

The reactive sputtering method according to the related art sputters a target including a group-III element, such as Ga or Al, generates the plasma of reactive gas including a nitrogen element, such as nitrogen, in a chamber of a sputtering apparatus, and reacts the group-III element with the reactive gas to form a group-III nitride semiconductor layer.

Specifically, for example, a method has been proposed which forms GaN layers on the (100) plane of Si and the (0001) plane of sapphire ($Al_2O_3$) by an RF magnetron sputtering method using $N_2$ gas (for example, see Non-Patent Document 1).

[Non-Patent Document 1] Y. USHIKU, et al., "Proceedings of the 21st Century Combined Symposium", Vol. 2, p 295 (2003)

DISCLOSURE OF THE INVENTION

Problems to be Solved by the Invention

However, in the reactive sputtering method according to the related art, it is necessary to further improve the crystallinity of a group-III nitride semiconductor layer.

The present invention has been made in order to solve the above problems, and an object of the present invention is to provide an apparatus for manufacturing a group-III nitride semiconductor layer having high crystallinity.

Another object of the present invention is to provide a method of manufacturing a group-III nitride semiconductor layer having high crystallinity.

Still another object of the present invention is to provide a method of manufacturing a group-III nitride semiconductor light-emitting device using the method of manufacturing a group-III nitride semiconductor layer, a group-III nitride semiconductor light-emitting device obtained by the method of manufacturing a group-III nitride semiconductor light-emitting device, and a lamp including the group-III nitride semiconductor light-emitting device.

Means for Solving the Problems

In order to solve the above problems, the inventors have conducted studies on the amount of raw material particles sputtered from a target and the amount of nitrogen in plasma. As a result, it has been found that it is possible to improve the crystallinity of a group-III nitride semiconductor layer by accurately controlling the amount of raw material particles sputtered from the target and the amount of nitrogen in plasma. However, in the reactive sputtering method according to the related art, the plasma including the raw material particles of a raw material sputtered from the target and the plasma of a reactive gas are simultaneously supplied to a substrate. Therefore, it is difficult to accurately control the amount of raw material particles or the amount of reactive gas in the plasma.

Therefore, the present inventions have found that it is possible to accurately control the amount of raw material particles and the amount of nitrogen in plasma supplied to a substrate by separately supplying plasma for supplying the raw material particles to the substrate and plasma including a nitrogen element to the substrate, by which the present invention was achieved.

That is, the present invention is as follows.

According to a first aspect of the present invention, there is provided an apparatus for manufacturing a group-III nitride semiconductor layer on a substrate using a sputtering method. The apparatus includes: a chamber; a target that is arranged in the chamber and includes a group-III element; a first plasma generating means that generates a first plasma for sputtering the target to supply raw material particles to the substrate; a second plasma generating means that generates a second plasma including a nitrogen element; and a control means that controls the first plasma generating means and the second plasma generating means to alternately generate the first plasma and the second plasma in the chamber.

According to a second aspect of the present invention, in the apparatus for manufacturing a group-III nitride semiconductor layer according to the first aspect, preferably, the first plasma generating means includes: a means that supplies power to the target; and a rare gas supply means that supplies a rare gas into the chamber, and the second plasma generating means includes: a means that generates plasma in the chamber; and a raw material gas supply means that supplies a raw material gas including a nitrogen element into the chamber.

According to a third aspect of the present invention, there is provided an apparatus for manufacturing a group-III nitride semiconductor layer on a substrate using a sputtering method. The apparatus includes: a chamber that includes a first plasma region and a second plasma region separated from the first plasma region by a shielding wall; a first plasma generating means that generates a first plasma for sputtering a target which is arranged in the first plasma region and includes a group-III element to supply raw material particles to the substrate in the first plasma region; a second plasma generating means that generates a second plasma including a nitrogen element in the second plasma region; and a moving means that moves the substrate from the first plasma region to the second plasma region and from the second plasma region to the first plasma region to alternately supply the raw material particles and the nitrogen element onto the substrate.

According to a fourth aspect of the present invention, in the apparatus for manufacturing a group-III nitride semiconductor layer according to any one of the first to third aspects, preferably, the target includes Al or Ga.

According to a fifth aspect of the present invention, in the apparatus for manufacturing a group-III nitride semiconductor layer according to any one of the first to fourth aspects, preferably, the first plasma generating means forms a film having a thickness in the range of 0.2 nm to 2 nm.

According to a sixth aspect of the present invention, in the apparatus for manufacturing a group-III nitride semiconductor layer according to any one of the first to fourth aspects, preferably, the first plasma generating means forms a thin film having a thickness corresponding to one atomic layer.

According to a seventh aspect of the present invention, in the apparatus for manufacturing a group-III nitride semiconductor layer according to any one of the first to sixth aspects, preferably, the second plasma generating means generates the second plasma including the nitrogen element using inductively coupled plasma.

According to an eighth aspect of the present invention, there is provided a method of manufacturing a group-III nitride semiconductor layer on a substrate using a sputtering method. The method includes: a first plasma generating step of generating a first plasma for sputtering a target including a group-III element to supply raw material particles to the substrate; and a second plasma generating step of generating a second plasma including a nitrogen element. The first plasma generating step and the second plasma generating step are alternately performed to alternately generate the first plasma and the second plasma in a chamber.

According to a ninth aspect of the present invention, there is provided a method of manufacturing a group-III nitride semiconductor layer on a substrate by a sputtering method using a group-III nitride semiconductor layer manufacturing apparatus that includes a chamber having a first plasma region and a second plasma region separated from the first plasma region by a shielding wall. The method includes: a first plasma generating step of generating a first plasma for sputtering a target which is arranged in the first plasma region and includes a group-III element to supply raw material particles to the substrate; a second plasma generating step of generating a second plasma including a nitrogen element in the second plasma region; a first moving step of moving the substrate from the first plasma region to the second plasma region after the first plasma generating step; and a second moving step of moving the substrate from the second plasma region to the first plasma region after the second plasma generating step, thereby alternately supplying the raw material particles and the nitrogen element onto the substrate.

According to a tenth aspect of the present invention, in the method of manufacturing a group-III nitride semiconductor layer according to the eighth or ninth aspect, preferably, the target includes Al or Ga.

According to an eleventh aspect of the present invention, in the method of manufacturing a group-III nitride semiconductor layer according to any one of the eighth to tenth aspects, preferably, the first plasma generating step forms a film having a thickness in the range of 0.2 nm to 2 nm.

According to a twelfth aspect of the present invention, in the method of manufacturing a group-III nitride semiconductor layer according to any one of the eighth to tenth aspects, preferably, the first plasma generating step forms a thin film having a thickness corresponding to one atomic layer.

According to a thirteenth aspect of the present invention, there is provided a method of manufacturing a group-III nitride semiconductor light-emitting device including a semiconductor layer, which is a laminate of an n-type semiconductor layer, a light-emitting layer, and a p-type semiconductor layer made of group-III nitride semiconductors, formed on a substrate. The method includes: forming at least a portion of the semiconductor layer using the method of manufacturing a group-III nitride semiconductor layer according to any one of the eighth to twelfth aspects.

According to a fourteenth aspect of the present invention, there is provided a method of manufacturing a group-III nitride semiconductor light-emitting device including a semiconductor layer, which is a laminate of an n-type semiconductor layer, a light-emitting layer, and a p-type semiconductor layer made of group-III nitride semiconductors, formed on a substrate and a buffer layer that is made of a group-III nitride semiconductor and is interposed between the substrate and the n-type semiconductor layer. The method includes: forming the buffer layer using the method of manufacturing a group-III nitride semiconductor layer according to any one of the eighth to twelfth aspects.

According to a fifteenth aspect of the present invention, a group-III nitride semiconductor light-emitting device is manufactured by the method of manufacturing a group-III nitride semiconductor light-emitting device according to the thirteenth or fourteenth aspect.

According to a sixteenth aspect of the present invention, a lamp includes the group-III nitride semiconductor light-emitting device according to the fifteenth aspect.

According to a seventeenth aspect of the present invention, a group-III nitride semiconductor light-emitting device includes: a substrate; and a semiconductor layer that has a laminated structure of an n-type semiconductor layer, a light-emitting layer, and a p-type semiconductor layer made of group-III nitride semiconductors and is formed on the substrate. At least a portion of the semiconductor layer is formed by the method of manufacturing a group-III nitride semiconductor layer according to any one of the eighth to twelfth aspects, and the laminated structure is formed by the manufacturing method.

According to an eighteenth aspect of the present invention, a group-III nitride semiconductor light-emitting device includes: a substrate; a semiconductor layer that has a laminated structure of an n-type semiconductor layer, a light-emitting layer, and a p-type semiconductor layer made of group-III nitride semiconductors and is formed on the substrate; and a buffer layer that is made of a group-III nitride semiconductor and is interposed between the substrate and the n-type semiconductor layer. The buffer layer is formed by the method of manufacturing a group-III nitride semiconductor layer according to any one of the eighth to twelfth aspects, and the laminated structure is formed by the manufacturing method.

Effects of the Invention

According to an aspect of the present invention, an apparatus for manufacturing a group-III nitride semiconductor layer includes: a first plasma generating means that generates a first plasma for sputtering a target to supply raw material particles to the substrate; a second plasma generating means that generates a second plasma including a nitrogen element; and a control means that controls the first plasma generating means and the second plasma generating means to alternately generate the first plasma and the second plasma in the chamber. According to this structure, it is possible to separately supply the raw material particles and the nitrogen element to the substrate. Therefore, according to the apparatus for manufacturing a group-III nitride semiconductor layer of the present invention, it is possible to easily and accurately control the amount of raw material particles and nitrogen element supplied to the substrate, and form a group-III nitride semiconductor layer having high crystallinity.

According to another aspect of the present invention, an apparatus for manufacturing a group-III nitride semiconductor layer includes: a chamber that includes a first plasma region and a second plasma region separated from the first plasma region by a shielding wall; a first plasma generating means that generates a first plasma for sputtering a target which is arranged in the first plasma region and includes a group-III element to supply raw material particles to the substrate in the first plasma region; a second plasma generating means that generates a second plasma including a nitrogen element in the second plasma region; and a moving means that moves the substrate from the first plasma region to the second plasma region and from the second plasma region to the first plasma region to alternately supply the raw material particles and the nitrogen element onto the substrate. According to this structure, it is possible to separately supply the raw material particles and the nitrogen element to the substrate. Therefore, according to the apparatus for manufacturing a group-III nitride semiconductor layer of the present invention, it is possible to easily and accurately control the amount of raw material particles and nitrogen element supplied to the substrate, and form a group-III nitride semiconductor layer having high crystallinity.

According to still another aspect of the present invention, a method of manufacturing a group-III nitride semiconductor layer includes: a first plasma generating step of generating a first plasma for sputtering a target including a group-III element to supply raw material particles to a substrate; and a second plasma generating step of generating a second plasma including a nitrogen element. The first plasma generating step and the second plasma generating step are alternately performed to alternately generate the first plasma and the second plasma in a chamber. According to this structure, it is possible to separately supply the raw material particles and the nitrogen element to the substrate. Therefore, according to the method of manufacturing a group-III nitride semiconductor layer of the present invention, it is possible to easily and accurately control the amount of raw material particles and nitrogen element supplied to the substrate, and form a group-III nitride semiconductor layer having high crystallinity.

According to yet another aspect of the present invention, a method of manufacturing a group-III nitride semiconductor layer includes: a first plasma generating step of generating a first plasma for sputtering a target which is arranged in a first plasma region and includes a group-III element to supply raw material particles to a substrate; a second plasma generating step of generating a second plasma including a nitrogen element in a second plasma region; a first moving step of moving the substrate from the first plasma region to the second plasma region after the first plasma generating step; and a second moving step of moving the substrate from the second plasma region to the first plasma region after the second plasma generating step, thereby alternately supplying the raw material particles and the nitrogen element onto the substrate. According to this structure, it is possible to separately supply the raw material particles and the nitrogen element to the substrate. Therefore, according to the method of manufacturing a group-III nitride semiconductor layer of the present invention, it is possible to easily and accurately control the amount of raw material particles and nitrogen element supplied to the substrate, and form a group-III nitride semiconductor layer having high crystallinity.

According to still yet another aspect of the present invention, a method of manufacturing a group-III nitride semiconductor light-emitting device uses the method of manufacturing a group-III nitride semiconductor layer according to an above-mentioned aspect. Therefore, it is possible to obtain a group-III nitride semiconductor light-emitting device including a group-III nitride semiconductor layer with high crystallinity.

According to yet still another aspect of the present invention, a group-III nitride semiconductor light-emitting device and a lamp are obtained by the method of manufacturing a group-III nitride semiconductor light-emitting device according to the above-mentioned aspect. Therefore, the group-III nitride semiconductor light-emitting device or the lamp includes a group-III nitride semiconductor layer having high crystallinity. As a result, the group-III nitride semiconductor light-emitting device or the lamp has good emission characteristics.

REFERENCE NUMERALS

Figure 1:
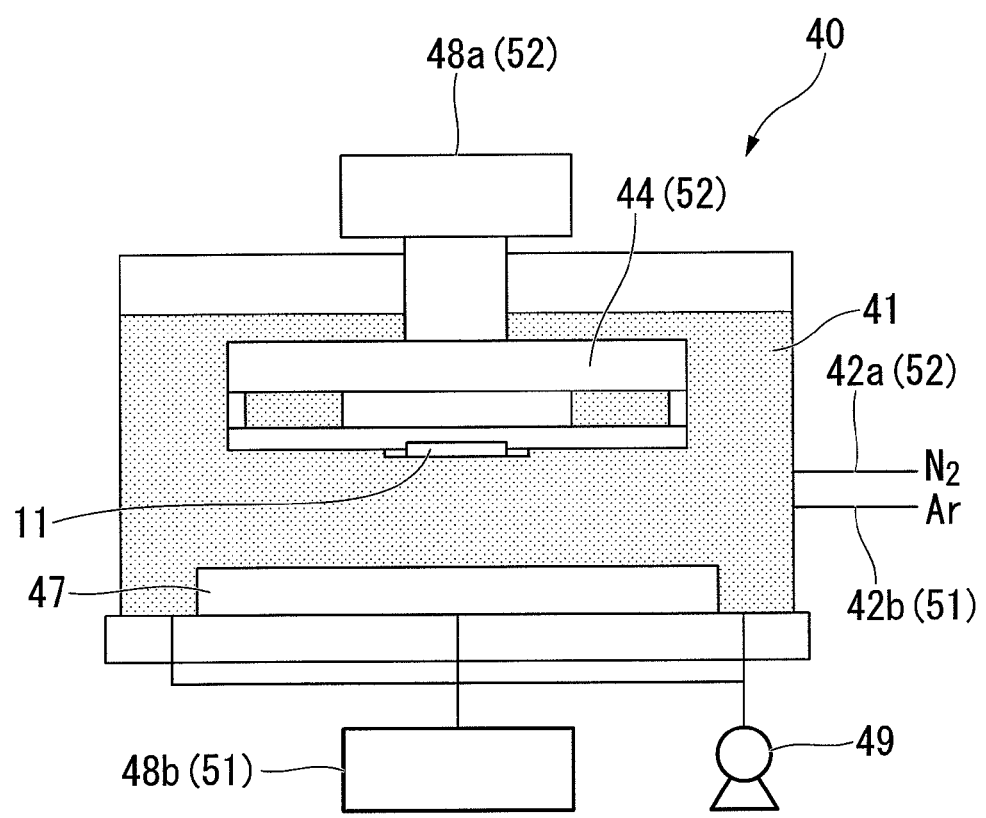
FIG. 1 is a diagram schematically illustrating a sputtering apparatus, which is an example of an apparatus for manufacturing a group-III nitride semiconductor layer according to the present invention.

1: Group-III nitride semiconductor light-emitting device (light-emitting device)
3: Lamp
10: Laminated semiconductor
11: Substrate
12: Buffer layer
14: N-type semiconductor layer
15: Light-emitting layer
16: P-type semiconductor layer
17: Transparent positive electrode
40, 50: Sputtering apparatus
41, 60: Chamber
61: Target chamber (first plasma region)
62: Nitrogen chamber (second plasma region)
43: Rotary tool (moving means)
44: Heater
45: Partition plate (shielding wall)
47: Target
48a, 48b, 48c, 48d: Power supply
51, 63: First plasma generating means
52, 64: Second plasma generating means

BEST MODE FOR CARRYING OUT THE INVENTION

Hereinafter, an apparatus for manufacturing a group-III nitride semiconductor layer, a method of manufacturing a group-III nitride semiconductor layer, a group-III nitride semiconductor light-emitting device, a method of manufacturing a group-III nitride semiconductor light-emitting device, and a lamp according to exemplary embodiments of the present invention will be described with reference to the accompanying drawings.

[Sputtering Apparatus (Apparatus for Manufacturing Group-III Nitride Semiconductor Layer)]

FIG. 1 is a diagram schematically illustrating the structure of a sputtering apparatus, which is an example of an apparatus for manufacturing a group-III nitride semiconductor layer according to the present invention. A sputtering apparatus 40 shown in FIG. 1 is for forming a group-III nitride semiconductor layer made of, for example, AlInGaN, AlN, or GaN. As shown in FIG. 1, the sputtering apparatus 40 includes a chamber 41, a target 47 that is provided in the chamber 41, a first plasma generating means 51 that generates a first plasma for sputtering the target 47 to supply raw material particles to a substrate 11, and a second plasma generating means 52 that generates a second plasma including a nitrogen element.

The sputtering apparatus 40 shown in FIG. 1 further includes a control means (not shown) that controls the first plasma generating means 51 and the second plasma generating means 52. In the sputtering apparatus 40 shown in FIG. 1, the control means controls the first plasma generating means 51 and the second plasma generating means 52 to alternately generate the first plasma and the second plasma such that the first plasma and the second plasma are alternately supplied to the chamber 41.

The first plasma generating means 51 includes a power supply 48b that supplies a predetermined power to the target 47 and an argon gas supply means 42b that supplies argon gas into the chamber 41. The power supply 48b can control the power (voltage applied) supplied to the target 47. In addition, the power supply 48b and the argon gas supply means 42b are controlled by the control means.

It is preferable that the first plasma generating means 51 form a thin film which is made of a material forming the target 47 and has a thickness in the range of 0.2 nm to 2 nm on the substrate. If the thickness is less than 0.2 nm, it is difficult to uniformly cover the entire surface of the substrate 11 or for the group-III nitride semiconductor layer to be grown, and a crystalline distribution may occur in the surface. On the other hand, if the thickness is greater than 2 nm, reaction occurs on only the surface of the film, and it is difficult to obtain uniformity in the thickness direction.

Further, it is preferable that the first plasma generating means 51 forms a thin film that is made of a material forming the target 47 and has a thickness corresponding to one atomic layer.

The second plasma generating means 52 includes a heater 44 that heats the substrate 11, a power supply 48a that is electrically connected to the heater 44 and the substrate 11, and a nitrogen gas supply means 42a (raw material gas supply means) that supplies nitrogen gas into the chamber 41. The power supply 48a can control the power (voltage applied) supplied to the heater 44.

The power supply 48a and the nitrogen gas supply means 42b are controlled by the control means (not shown).

The target 47 includes a group-III element, such as Ga or Al, corresponding to a group-III nitride semiconductor layer to be formed. The target 47 may include a dopant element, such as Si or Mg, if necessary. Alternatively, a dopant target piece made of a dopant element may be arranged on the target 47.

The sputtering apparatus 40 shown in FIG. 1 further includes a pressure control means 49, such as a pump, and can control the internal pressure of the chamber 41 to a predetermined level.

In this embodiment, the power supplies 48a and 48b supply power (voltage) in a pulsed DC manner or an RF (radio frequency) manner. When a DC electric field is continuously applied to the target 47, the target 47 is charged up, and an unstable discharge is obtained. Therefore, it is preferable to use a pulsed DC method of applying a pulse voltage.

[Method of Manufacturing Group-III Nitride Semiconductor Layer]

When the sputtering apparatus 40 shown in FIG. 1 is used to form a group-III nitride semiconductor layer on the substrate 11, the control means (supply means) (not shown) controls the first plasma generating means 51 and the second plasma generating means 52 to alternately perform a first plasma generating process of generating the first plasma for sputtering the target 47 to supply raw material particles to the substrate 11 and a second plasma generating process of generating the second plasma including a nitrogen element, thereby alternately supplying the first plasma and the second plasma into the chamber 41.

The manufacturing method according to this embodiment includes a first-second gas changing process of changing the atmosphere in the chamber 41 to a gas atmosphere for the second plasma generating process between the first plasma generating process and the second plasma generating process, and a second-first gas changing process of changing the atmosphere in the chamber 41 to a gas atmosphere for the first plasma generating process between the second plasma generating process and the first plasma generating process.

In this embodiment, before the first plasma generating process is performed, a pre-process of changing the atmosphere in the chamber 41 to a gas atmosphere for the first plasma generating process is performed. The pre-process is performed by using the argon gas supply means 42b to supply argon gas into the chamber 41.

After the pre-process, the argon gas supply means 42b and the pressure control means 49 are used to change the atmosphere in the chamber 41 to an argon atmosphere at a predetermined pressure, and the power supply 48b supplies a predetermined power to the target 47 to generate the first plasma for supplying the raw material particles to the substrate 11 (first plasma generating process). When the first plasma generating process is performed, the raw material particles of a material forming the target 47, such as particles of a group-III element, are emitted from the target 47 to the atmosphere in the chamber 41, and then collide with and are deposited on the surface of the substrate 11. In this way, a film made of the material forming the target 47 is formed on the substrate 11.

It is preferable that the internal pressure of the chamber 41 in the first plasma generating process be in the range of 0.1 to 10 Pa. If the internal pressure of the chamber 41 is lower than 0.1 Pa or higher than 10 Pa, an unstable discharge is obtained, which results in an unstable plasma.

The power supplied to the target 47 is preferably in the range of 0.1 W/cm$^2$ to 100 W/cm$^2$, more preferably, 1 W/cm$^2$ to 50 W/cm$^2$.

If the power supplied to the target 47 is lower than 0.1 W/cm$^2$, an unstable discharge is obtained, which results in an unstable plasma. If the power supplied to the target 47 is higher than 100 W/cm$^2$, the energy of the sputtered raw material particles is increased, and crystals are damaged.

The thin film that is formed of the material forming the target 47 in the first plasma generating process preferably has a thickness in the range of 0.2 nm to 2 nm, more preferably, a thickness corresponding to one atomic layer.

When the first plasma generating process ends, in order to start the second plasma generating process, the gas atmosphere in the chamber 41 is replaced with a gas atmosphere for the second plasma generating process (first-second gas changing process). In the first-second gas changing process, at the same time as when the first plasma generating process ends, the supply of the argon gas by the argon gas supply means 42b stops, and the nitrogen gas supply means 42a starts to supply nitrogen gas into the chamber 41. In addition, at the same time as when the first plasma generating process ends, the supply of power to the target 47 stops, and the power supply 48a starts to supply power to the substrate 11.

In this embodiment, the nitrogen gas is an active gas, but the present invention is not limited thereto. A nitride raw material that has generally been used may be used instead of the nitrogen gas. It is preferable that ammonia or nitrogen that is relatively inexpensive and easy to treat be used as the active gas. It is preferable to use ammonia because it has high degradation efficiency and can be deposited at a high growing speed. However, since ammonia has high reactivity, it is necessary that a material forming a member used for a reaction apparatus have high chemical stability, which results in an increase in apparatus costs. Therefore, it is most preferable to use nitrogen ($N_2$) as the active gas in terms of the apparatus costs.

It is preferable that the internal pressure of the chamber 41 and the power supplied from the power supply 48a to the substrate 11 in the first-second gas changing process be set in the following ranges such that the plasma in the chamber 41 is not removed.

Specifically, it is preferable that the internal pressure of the chamber 41 in the first-second gas changing process be in the range of 0.1 to 10 Pa. If the internal pressure of the chamber 41 is lower than 0.1 Pa or higher than 10 Pa, an unstable discharge is obtained, which results in an unstable plasma.

It is preferable that the power supplied from the power supply 48a to the substrate 11 in the first-second gas changing process be in the range of 10 W to 100 W. If the power supplied from the power supply 48a to the substrate 11 in the first-second gas changing process is lower than 10 W, an unstable discharge is obtained, which results in an unstable plasma. On the other hand, if the power supplied from the power supply 48a to the substrate 11 in the first-second gas changing process is higher than 100 W, damage of the group-III nitride semiconductor layer on the substrate 11 is increased due to Ar plasma, which may cause lowering of crystallinity.

Further, it is preferable that the first-second gas changing process be performed for 0.1 to 10 seconds. If the discharge time is shorter than 0.1 seconds, the gas in the chamber 41 may not be completely replaced. On the other hand, if the discharge time is longer than 10 seconds, the damage of the group-III nitride semiconductor layer on the substrate 11 is increased due to Ar plasma, which may cause lowering of crystallinity.

Thereafter, the nitrogen gas supply means 42a and the pressure control means 49 are used to change the gas atmosphere in the chamber 41 to a nitrogen atmosphere at a predetermined pressure, and the power supply 48a supplies a predetermined power to the substrate 11 to perform the second plasma generating process. When the second plasma generating process is performed, the second plasma including a nitrogen element is generated and supplied to the substrate 11, and the material forming the target 47 for forming a thin film on the surface of the substrate 11 in the first plasma generating process is nitrized, thereby forming a nitride.

It is preferable that the internal pressure of the chamber 41 in the second plasma generating process be in the range of 0.1 to 10 Pa. If the internal pressure of the chamber 41 is lower than 0.1 Pa or higher than 10 Pa, an unstable discharge is obtained, which results in an unstable plasma.

The power supplied from the power supply 48a to the substrate 11 in the second plasma generating process is preferably in the range of 10 W to 10 kW, more preferably, 50 W to 5 kW. If the power supplied from the power supply 48a to the substrate 11 in the second plasma generating process is lower than 10 W, an unstable discharge is obtained, which results in an unstable plasma. On the other hand, if the power supplied from the power supply 48a to the substrate 11 in the second plasma generating process is higher than 10 kW, the energy of the plasma is increased, and sputtering occurs in the substrate or the chamber 41.

When the second plasma generating process ends, in order to start the first plasma generating process again, the gas atmosphere in the chamber 41 is replaced with a gas atmosphere for the first plasma generating process (second-first gas changing process). In the second-first gas changing process, at the same time as when the second plasma generating process ends, the supply of nitrogen gas into the chamber 41 by the nitrogen gas supply means 42a stops, and the argon gas supply means 42b starts to supply argon gas into the chamber. In addition, in the second plasma generating process, a predetermined power is continuously supplied from the power supply 48a to the substrate 11.

It is preferable that the internal pressure of the chamber 41 and the power supplied from the power supply 48a to the substrate 11 in the second-first gas changing process be set in the following ranges such that the plasma in the chamber 41 is not removed.

Specifically, it is preferable that the internal pressure of the chamber 41 in the second-first gas changing process be in the range of 0.1 to 10 Pa. If the internal pressure of the chamber 41 is lower than 0.1 Pa or higher than 10 Pa, an unstable discharge is obtained, which results in an unstable plasma.

It is preferable that the power supplied from the power supply 48a to the substrate 11 in the second-first gas changing process be in the range of 10 W to 100 W. If the power supplied from the power supply 48a to the substrate 11 in the second-first gas changing process is lower than 10 W, an unstable discharge is obtained, which results in an unstable plasma. On the other hand, if the power supplied from the power supply 48a to the substrate 11 in the second-first gas changing process is higher than 100 W, damage of the group-III nitride semiconductor layer on the substrate 11 is increased due to Ar plasma, which may cause lowering of crystallinity.

Further, it is preferable that the second-first gas changing process be performed for 0.1 to 10 seconds. If the discharge time is shorter than 0.1 seconds, the gas in the chamber 41 may not be completely replaced. On the other hand, if the discharge time is longer than 10 seconds, damage of the group-III nitride semiconductor layer on the substrate 11 is increased due to Ar plasma, which may cause lowering of crystallinity.

Then, after the second-first gas changing process ends, the argon gas supply means 42b and the pressure control means 49 are used to change the gas atmosphere in the chamber 41 to an argon atmosphere at a predetermined pressure. The supply of power from the power supply 48a to the substrate 11 stops, and the power supply 48b supplies a predetermined power to the target 47 to generate the first plasma including a group-III element (first plasma generating process).

In this embodiment, after a pre-process, the first plasma generating process, the first-second gas changing process, the second plasma generating process, and the second-first gas changing process are repeatedly performed a predetermined number of times in this order, and in the final stage, the first plasma generating process to the second plasma generating process are performed without executing the second-first gas changing process to form a group-III nitride semiconductor layer with a predetermined thickness on the surface of the substrate 11.

It is preferable that the deposition rate of the group-III nitride semiconductor layer formed by the first plasma generating process and the second plasma generating process be in the range of 5 nm/min to 300 nm/min. If the deposition speed is lower than 5 nm/min, the reaction between a group-III metal and oxygen in the chamber 41 is affected and the crystallinity of the group-III nitride semiconductor is reduced. On the other hand, if the deposition speed is higher than 300 nm/min, the migration time of the group-III metal sputtered onto the substrate 11 is insufficient, which results in low crystallinity.

The sputtering apparatus 40 according to this embodiment includes the first plasma generating means that generates the first plasma for sputtering the target 47 to supply raw material particles to the substrate 11, the second plasma generating means that generates the second plasma including a nitrogen element, and the control means that controls the first plasma generating means and the second plasma generating means to alternately supply the first plasma and the second plasma into the chamber 41. Therefore, the sputtering apparatus can separately supply the raw material particles and the nitrogen element to the substrate 11. In this way, it is possible to easily and accurately control the amount of raw material particles and nitrogen element supplied to the substrate 11, and form a group-III nitride semiconductor layer with high crystallinity.

In addition, the method of manufacturing a group-III nitride semiconductor layer according to this embodiment includes the first plasma generating process of generating the first plasma for sputtering the target 47 including a group-III element to supply raw material particles to the substrate 11, and the second plasma generating process of generating the second plasma including a nitrogen element. The first plasma generating process and the second plasma generating process are alternately performed to alternately supply the first plasma and the second plasma into the chamber 41. Therefore, it is possible to separately supply the raw material particles and the nitrogen element to the substrate 11. In this way, it is possible to easily and accurately control the amount of raw material particles and nitrogen element supplied to the substrate 11, and form a group-III nitride semiconductor layer with high crystallinity.

The method of manufacturing a group-III nitride semiconductor layer according to this embodiment includes the first-second gas changing process that is performed between the first plasma generating process and the second plasma generating process, and the second-first gas changing process that is performed between the second plasma generating process and the first plasma generating process. The first-second gas changing process stops the supply of argon gas and starts the supply of nitrogen gas at the same time as when the first plasma generating process ends. In addition, the first-second gas changing process stops the supply of power to the target 47 and starts the supply of power to the substrate 11. The second-first gas changing process stops the supply of nitrogen gas and starts the supply of argon gas at the same time as when the second plasma generating process ends. In addition, the second-first gas changing process continuously supplies power to the substrate 11. In this way, it is possible to accurately control the thickness of a group-III nitride semiconductor layer formed on the substrate 11, which will be described below.

That is, in this embodiment, in both the first-second gas changing process and the second-first gas changing process, the supply of power to the target 47 stops. Therefore, during the first-second gas changing process and the second-first gas changing process, the particles of the material forming the target 47 are prevented from being supplied to the atmosphere in the chamber 41. Therefore, in the processes other than the first plasma generating process, it is possible to prevent a thin film from being formed of the material forming the target 47, and it is possible to accurately control the thickness of the group-III nitride semiconductor layer formed on the substrate 11.

Further, in this embodiment, when the first plasma generating process starts, the atmosphere in the chamber 41 is changed to a gas atmosphere for the first plasma generating process. Therefore, a variation in deposition speed is reduced when the first plasma generating process starts, and it is possible to accurately control the thickness of the group-III nitride semiconductor layer formed on the substrate 11.

In the method of manufacturing a group-III nitride semiconductor layer according to this embodiment, when nitrogen gas is supplied, the supply of power to the target 47 stops. Therefore, it is possible to prevent the reaction between nitrogen plasma and a group-III element on the target 47, and maintain the target 47 in a predetermined state all the time.

In the method of manufacturing a group-III nitride semiconductor layer according to this embodiment, in the first-second gas changing process, the supply of power to the target 47 stops and the supply of power to the substrate 11 starts at the same time as when the first plasma generating process ends. In the second-first gas changing process, power is continuously supplied to the substrate 11. Therefore, the supply of power to the target 47 and the supply of power to the substrate 11 do not stop at the same time, and the plasma in the chamber 41 is not removed during the first-second gas changing process and the second-first gas changing process. As a result, it is possible to generate plasma when power is supplied to the target 47 or the substrate 11.

[Other Examples of Sputtering Apparatus]

Figure 2A:
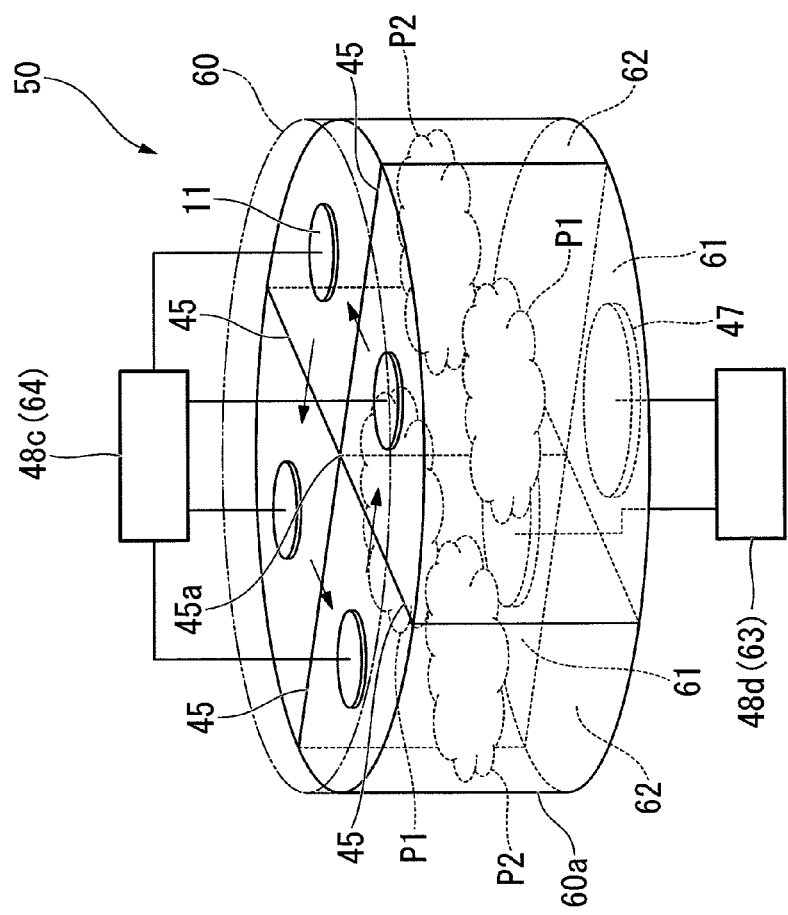
FIG. 2 is a diagram schematically illustrating a sputtering apparatus, which is another example of the apparatus for manufacturing a group-III nitride semiconductor layer according to the present invention.
Figure 2B:
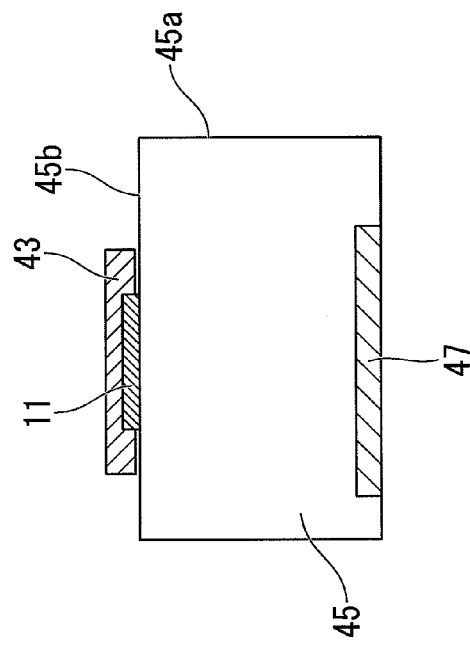

FIG. 2 is a diagram schematically illustrating a sputtering apparatus, which is another example of the apparatus for manufacturing a group-III nitride semiconductor layer according to the present invention. FIG. 2A is a perspective view schematically illustrating the sputtering apparatus, and FIG. 2B is a diagram illustrating the arrangement relationship between a target 47 and a substrate 11 in the sputtering apparatus shown in FIG. 2A. In a sputtering apparatus 50 shown in FIG. 2, the same components as those in the sputtering apparatus 40 shown in FIG. 1 are denoted by the same reference numerals, and a detailed description thereof will be omitted. In FIG. 2A, for easy viewing, a rotary tool (moving means) 43 is omitted.

The sputtering apparatus 50 shown in FIG. 2 is for forming a group-III nitride semiconductor layer made of, for example, AlInGaN, AlN, or GaN, similar to the sputtering apparatus 40 shown in FIG. 1.

In the sputtering apparatus 50, as shown in FIG. 2A, a chamber 60 includes two target chambers (first plasma regions) 61 and two nitrogen chambers (second plasma regions) 62. The target chamber 61 is a region for generating a first plasma P1 that supplies raw material particles to the substrate 11, and the nitrogen chamber 62 is a region for generating a second plasma P2.

As shown in FIG. 2A, four partition plates (shielding walls) 45 are arranged in the chamber 60 in a cross shape in plan view, and the target chambers 61 and the nitrogen chambers 62 are separated from each other by the partition plates 45. Therefore, each of the target chambers 61 and the nitrogen chambers 62 is a region having a fan shape in plan view that is surrounded by two partition plates 45 and an arc-shaped outer wall 60a. Each of the target chambers 61 is adjacent to the nitrogen chamber 62 with the partition plate 45 interposed therebetween, and each of the nitrogen chambers 62 is adjacent to the target chamber 61 with the partition plate 45 interposed therebetween.

The targets 47 are provided in the target chambers 61 of the sputtering apparatus 50 shown in FIG. 2. As shown in FIGS. 2A and 2B, the target 47 is arranged so as to face the substrate 11 that is supported by the rotary tool 43. As shown in FIG. 2B, the rotary tool 43 is provided above an upper end 45b of the partition plate 45, and supports the substrate 11 at a position that is above the upper end 45b of the partition plate 45 such that the substrate 11 faces downward. In addition, the rotary tool 43 rotates on a connection portion 45a of the four partition plates 45 arranged in a cross shape in plan view, while supporting the substrates 11, thereby moving the substrates 11 from the target chambers 61 to the nitrogen chambers 62 and from the nitrogen chambers 62 to the target chambers 61.

In this embodiment, as shown in FIG. 2A, four substrates 11 are arranged in the chamber 60. That is, the four substrates 11 are provided in the target chambers 61 and the nitrogen chambers 62. In this embodiment, the rotary tool 43 also serves as a heater that individually heats the substrates 11.

The sputtering apparatus 50 further includes a first plasma generating means 63 that generates the first plasma P1 for sputtering the target 47 in the target chamber 61 to supply the raw material particles of a raw material included in the target 47 to the substrate 11, and a second plasma generating means 64 that generates the second plasma P2 including a nitrogen element in the nitrogen chamber 62. In the sputtering apparatus 50 shown in FIG. 2, the rotary tool 43 is rotated to move the substrate 11 from the target chamber 61 to the nitrogen chamber 62, and then move the substrate from the nitrogen chamber 62 to the target chamber 61, thereby alternately supplying the raw material particles and the nitrogen element onto the substrate 11.

The first plasma generating means 63 includes a power supply 48d that supplies a predetermined power to each of the targets 47 arranged in the target chambers 61, and an argon gas supply means (not shown) that supplies argon gas into each of the target chambers 61. The power (voltage applied) supplied to the target 47 can be controlled by the power supply 48d. In addition, the power supply 48d and the argon gas supply means are controlled by a control means (not shown).

Similar to the sputtering apparatus 40 shown in FIG. 1, it is preferable that the first plasma generating means 63 forms a thin film that is made of a material forming the target 47 with a thickness in the range of 0.2 nm to 2 nm. Alternatively, it is preferable that the first plasma generating means 63 forms a thin film that is made of the material forming the target 47 with a thickness corresponding to one atomic layer.

The second plasma generating means 64 includes a power supply 48c that is electrically connected to the rotary tool 43, serving as a heater for individually heating the substrates 11, and a nitrogen gas supply means (not shown) that supplies nitrogen gas into each of the nitrogen chambers 62. The power (voltage applied) supplied to the rotary tool 43 is controlled by the power supply 48c. In addition, the power supply 48c and the nitrogen gas supply means are controlled by the control means (not shown).

In the sputtering apparatus 50 shown in FIG. 2, the same pressure control means (not shown), such as a pump, as that in the sputtering apparatus 40 shown in FIG. 1 is provided in each of the target chambers 61 and the nitrogen chambers 62. Therefore, it is possible to individually control the internal pressures of the target chambers 61 and the nitrogen chambers 62 at a predetermined level.

In this embodiment, similar to the sputtering apparatus 40 shown in FIG. 1, the power supplies 48c and 48d supply power (voltage applied) in a pulse DC manner or an RF (radio frequency) manner.

[Method of Manufacturing Group-III Nitride Semiconductor Layer]

Next, a method of forming a group-III nitride semiconductor layer on the substrate 11 using the sputtering apparatus 50 shown in FIG. 2 will be described. In this embodiment, the rotary tool 43 is rotated to alternately perform a process of moving the substrate 11 from the target chamber 61 to the nitrogen chamber 62 (first moving process) and a process of moving the substrate 11 from the nitrogen chamber 62 to the target chamber 61 (second moving process). In this way, the first plasma generating process and the second plasma generating process are alternately performed on each of the substrates 11, thereby alternately supplying raw material particles and a nitrogen element to each of the substrates 11.

In this embodiment, the first plasma is continuously generated in the target chambers 61, and the second plasma is continuously generated in the nitrogen chambers 62, while the rotary tool 43 is rotated at a predetermined rotational speed, thereby alternately performing a predetermined first plasma generating process and a predetermined second plasma generating process on each of the substrates 11. Therefore, in this embodiment, except when the first plasma generating process and the second plasma generating process are performed at the beginning, the first plasma generating process is continuously performed in the target chambers 61, and the second plasma generating process is continuously performed in the nitrogen chambers 62.

In this embodiment, since the target chamber 61 and the nitrogen chamber 62 have substantially the same area, the first plasma generating means 63 and the second plasma generating means 64 control the process speeds of the first plasma generating process and the second plasma generating process such that a predetermined first plasma generating process and a predetermined second plasma generating process can be performed while the rotary tool 43 is rotated at a predetermined speed, thereby making the time when the substrate 11 stays in the target chamber 61 equal to the time when the substrate 11 stays in the nitrogen chamber 62.

The process speeds of the first plasma generating process and the second plasma generating process may be adjusted, or the areas of the target chamber 61 and the nitrogen chamber 62 may be adjusted while adjusting the process speeds thereof to adjust the time when the substrates stay in the target chamber 61 and the nitrogen chamber 62, such that the rotary tool 43 can be rotated at a predetermined speed.

When the target chamber 61 and the nitrogen chamber 62 have substantially the same area and the substrate 11 is arranged in only one of the target chamber 61 and the nitrogen chamber 62, a predetermined first plasma generating process and a predetermined second plasma generating process may be performed by setting the time when the substrate 11 stays in the target chamber 61 to be different from the time when the substrate 11 stays in the nitrogen chamber 62, such that the rotational speed of the rotary tool 43 varies at a predetermined time interval.

In this embodiment, first, as shown in FIG. 2A, four substrates 11 are supported by the rotary tool 43. Then, before the first plasma generating process is performed at the beginning, a first pre-process of changing the atmosphere in each of the target chambers 61 to a gas atmosphere for the first plasma generating process is performed. The first pre-process can be performed by using the argon gas supply means to supply argon gas into the target chambers 61. Then, the first plasma generating process is performed in the target chambers 61, similar to the case in which the sputtering apparatus 40 shown in FIG. 1 is used.

In addition, while the first plasma generating process is performed at the beginning, a second pre-process of changing the atmosphere in each of the nitrogen chambers 62 to a gas atmosphere for the second plasma generating process is performed. The second pre-process can be performed by using the nitrogen gas supply means to supply nitrogen gas into the nitrogen chambers 62.

Then, when the first plasma generating process ends, the rotary tool 43 is rotated at a predetermined rotational speed to move the substrates 11 in the target chambers 61 from the target chambers 61 to the nitrogen chambers 62 (first moving process), and the second plasma generating process is performed in the nitrogen chambers 62 at the beginning, similar to the case in which the sputtering apparatus 40 shown in FIG. 1 is used.

While the first plasma generating process is performed at the beginning, the substrate 11 arranged in the nitrogen chamber 62 is moved from the nitrogen chamber 62 to the target chamber 61 at the same time as when the substrate 11 arranged in the target chamber 61 is moved from the target chamber 61 to the nitrogen chamber 62 during the first plasma generating process, and the first plasma generating process starts in the target chambers 61.

Then, when the second plasma generating process ends, the rotary tool 43 is rotated at a predetermined rotational speed to move the substrates 11 arranged in the nitrogen chambers 62 from the nitrogen chambers 62 to the target chambers 61 (second moving process).

The rotary tool 43 makes a predetermined number of revolutions at a predetermined rotational speed to repeatedly perform the first plasma generating process and the second plasma generating process a predetermined number of times, thereby forming a group-III nitride semiconductor layer with a predetermined thickness on the surface of the substrate 11.

The sputtering apparatus 50 according to this embodiment includes: the chamber 60 provided with the target chambers 61 and the nitrogen chambers 62; the first plasma generating means 63 that generates the first plasma P1 for sputtering the targets 47 arranged in the target chambers 61 to supply raw material particles to the substrates 11; the second plasma generating means 64 that generates the second plasma P2 including a nitrogen element; and the rotary tool 43 that moves the substrates 11 from the target chambers 61 to the nitrogen chambers 62 and from the nitrogen chambers 62 to the target chambers 61 to alternately supply the raw material particles and the nitrogen element onto the substrates 11. The rotary tool 43 can move the substrates 11 to separately supply the raw material particles and the nitrogen element to the substrates 11, and it is possible to easily and accurately control the amount of raw material particles and nitrogen element supplied to the substrates 11. As a result, it is possible to form a group-III nitride semiconductor layer with high crystallinity.

In the sputtering apparatus 50 according to this embodiment, the chamber 60 includes the target chambers 61 having the targets 47 arranged therein and the nitrogen chambers 62 that are separated from the target chambers 61 by the shielding wall and generate the second plasma P2. Therefore, it is possible to prevent contact between the second plasma P2 and the target 47. According to the sputtering apparatus 50 of this embodiment, no problem occurs due to a nitride film formed on the surface of the target 47, and it is possible to form crystals of a group-III nitride semiconductor layer with a predetermined thickness and high crystallinity.

In contrast, a sputtering method according to the related art performs sputtering on a target that includes a group-III element, such as Ga or Al, and is arranged in a chamber of a sputtering apparatus to generate plasma and a reactive gas plasma including a nitrogen element, such as nitrogen, and reacts the group-III element with the reactive gas to form a group-III nitride semiconductor layer. Therefore, the sputtering method according to the related art generates a reactive gas plasma in the chamber having the target arranged therein. Thus, in the sputtering method according to the related art, a portion of the reactive gas plasma including the nitrogen element reacts with the surface of the target and a nitride film is formed on the surface of the target.

When the nitride film is formed on the surface of the target, the sputtering rate varies. Therefore, it is difficult to control the thickness of a group-III nitride semiconductor layer to be formed, and the nitride film formed on the surface of the target is sputtered, which makes it difficult to form crystals of a group-III nitride semiconductor layer with high crystallinity on a substrate. In particular, the problem becomes remarkable when the group-III nitride semiconductor layer is continuously formed for a long time.

The sputtering apparatus 50 according to this embodiment is provided with the rotary tool 43 that moves the substrates 11 from the target chambers 61 to the nitrogen chambers 62 and from the nitrogen chambers 62 to the target chambers 61. Therefore, after the first plasma generating process is performed in the target chambers 61, it is possible to easily perform the second plasma generating process in the nitrogen chambers 62. After the second plasma generating process is performed in the nitrogen chambers 62, it is possible to easily perform the first plasma generating process in the target chambers 61.

In this embodiment, the sputtering apparatus is provided with the rotary tool 43 that moves the substrates 11 from the target chambers 61 to the nitrogen chambers 62 and from the nitrogen chambers 62 to the target chambers 61. However, instead of the rotary tool 43, a rotary tool that rotates the chamber 60 on the connection portion 45a of the partition plates 45 may be provided to move the target chambers to the nitrogen chambers and move the nitrogen chambers to the target chambers, with the substrate 11 being fixed. In this case, similar to this embodiment, after the first plasma generating process is performed in the target chambers 61, it is possible to easily perform the second plasma generating process in the nitrogen chambers 62. After the second plasma generating process is performed in the nitrogen chambers 62, it is possible to easily perform the first plasma generating process in the target chambers 61.

In the sputtering apparatus 50 according to this embodiment, the rotary tool 43 moves the substrates 11 from the target chambers 61 to the nitrogen chambers 62 and from the nitrogen chambers 62 to the target chambers 61. According to this structure, it is possible to continuously perform the first plasma generating process and the second plasma generating process without changing the setting conditions of the target chambers 61 and the nitrogen chambers 62. Therefore, it is not necessary to reset the setting conditions of the target chambers 61 and the nitrogen chambers 62 whenever the first plasma generating process is switched to the second plasma generating process or the second plasma generating process is switched to the first plasma generating process, and there is no error due to the resetting of the setting conditions. As a result, it is possible to easily and accurately control the amount of the first plasma P1 and second plasma P2 supplied to the substrate 11, resulting in an increase in productivity.

In the method of manufacturing a group-III nitride semiconductor layer according to this embodiment, the first plasma generating process of generating the first plasma for sputtering a target including a group-III element to supply the raw material particles of a raw material included in the target 47 to the substrate 11 is performed in the target chamber 61, and the second plasma generating process of generating the second plasma P2 including a nitrogen element is performed in the nitrogen chamber 62. In addition, the first moving process of moving the substrates 11 from the target chambers 61 to the nitrogen chambers 62 after the first plasma generating process is performed, and the second moving process of moving the substrates 11 from the nitrogen chambers 62 to the target chambers 61 after the second plasma generating process is performed are executed to alternately supply the raw material particles and the nitrogen element onto the substrates 11. In this way, it is possible to separately supply the raw material particles and the nitrogen element to the substrates 11. Therefore, it is possible to easily and accurately control the amount of raw material particles and nitrogen element supplied to the substrate 11, and form a group-III nitride semiconductor layer with high crystallinity.

In the manufacturing method according to this embodiment, four substrates 11 are supported by the rotary tool 43, and except when the first plasma generating process and the second plasma generating process are performed at the beginning, the first plasma generating process is continuously performed in the target chambers 61, and the second plasma generating process is continuously performed in the nitrogen chambers 62, thereby forming group-III nitride semiconductor layers on the four substrates 11 in parallel. Therefore, it is possible to form high-quality group-III nitride semiconductor layers on the four substrates 11 with high efficiency.

In addition, a transmission electron microscope (TEM) was used to observe the cross-section of the group-III nitride semiconductor layer manufactured by the above-mentioned embodiments. As a result, a stripe pattern, such as a laminated structure of a plurality of layers, was observed. It is considered that the reason why the stripe-shaped laminated structure is observed is that the first plasma generating process and the second plasma generating process are alternately performed to cause a variation in impurity concentration or composition. The stripe-shaped laminated structure can be observed at an interval of 3 to 100 nm by the transmission electron microscope (TEM) in the current technology. However, actually, it is presumed that a laminated structure of a plurality of thin films is formed at an interval corresponding to the thickness of the thin film formed by the first plasma generating process. Therefore, according to the above-described embodiment, the formation of the laminated structure makes it possible to reduce crystal distortion.

The apparatus for manufacturing a group-III nitride semiconductor layer according to the present invention is not limited to the above-described embodiment. For example, the second plasma generating means may generate the second plasma including a nitrogen element by inductively coupled plasma (ICP).

Next, a group-III nitride semiconductor light-emitting device (hereinafter, abbreviated to as a light-emitting device) and a method of manufacturing the same according to the present invention will be described.

[Group-III Nitride Semiconductor Light-Emitting Device]

Figure 3:
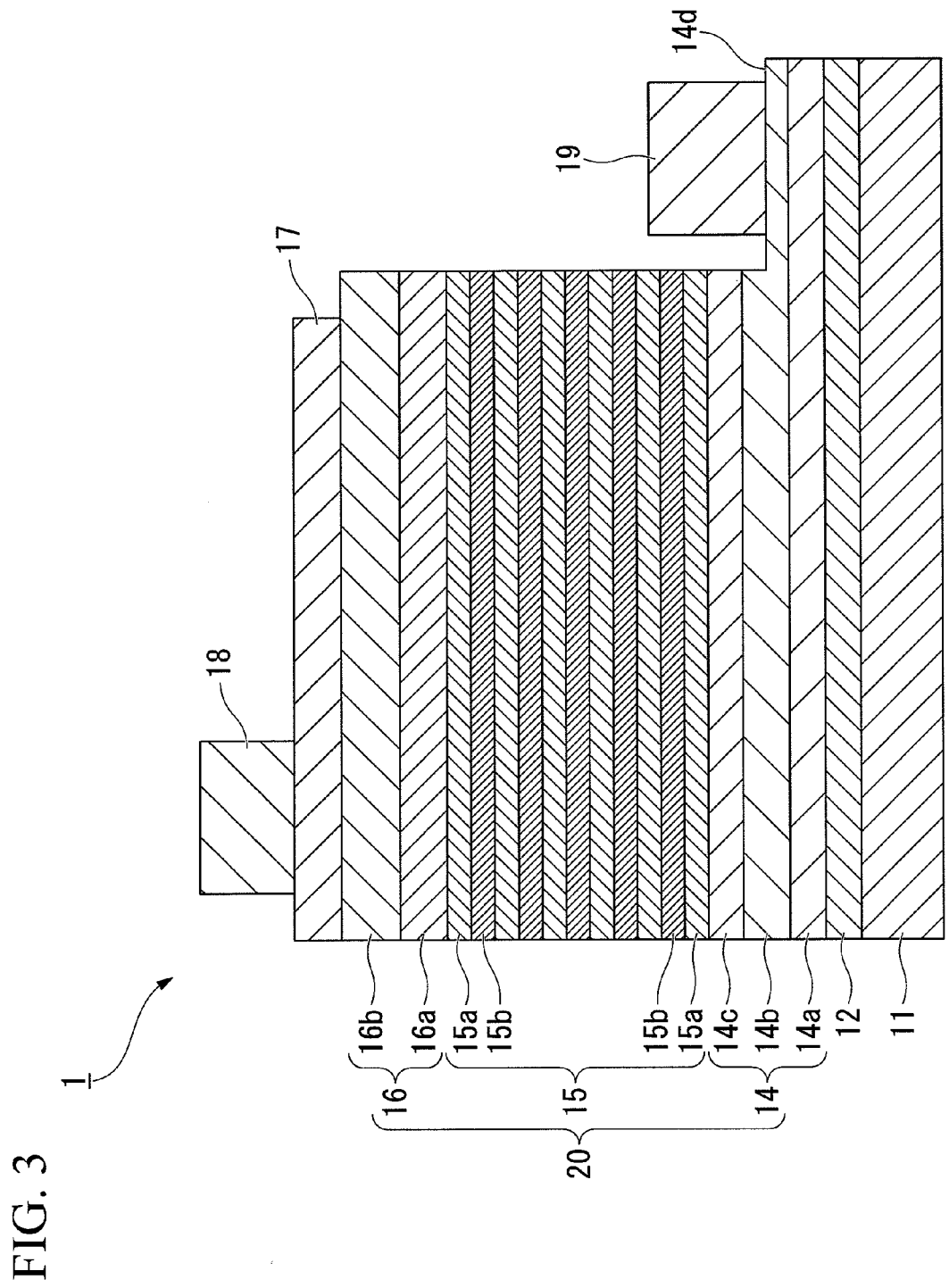
FIG. 3 is a cross-sectional view schematically illustrating an example of a group-III nitride semiconductor light-emitting device according to the present invention.
Figure 4:
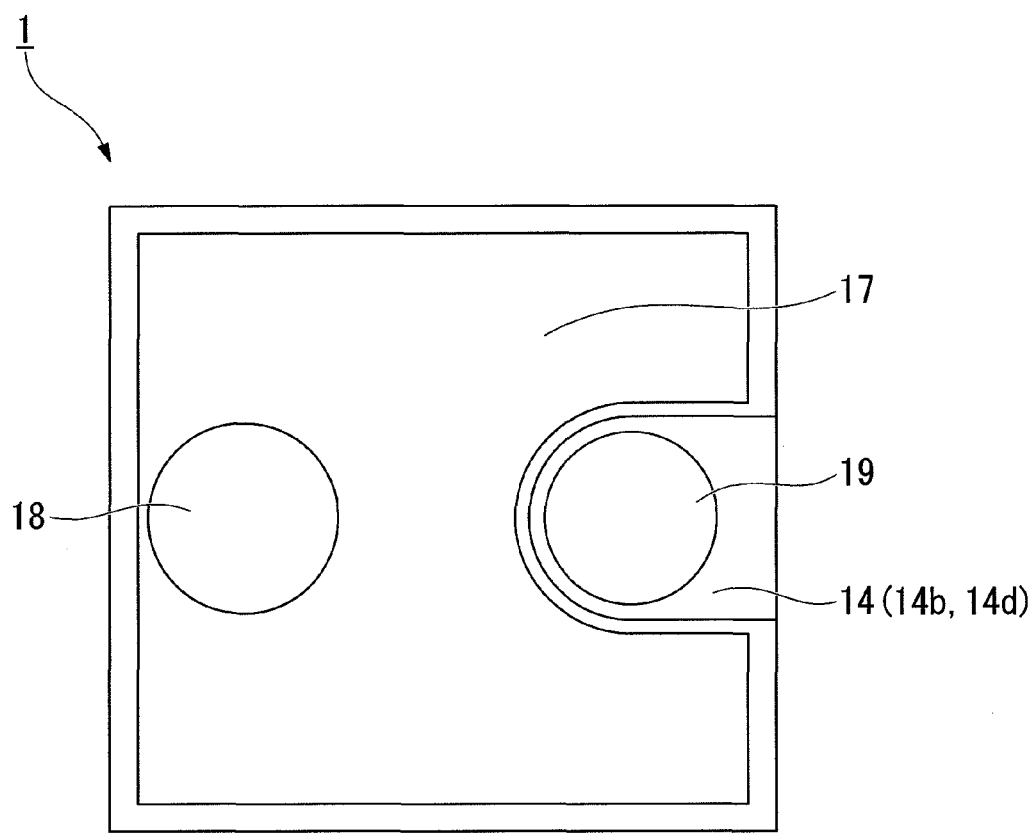
FIG. 4 is a plan view schematically illustrating the structure of the group-III nitride semiconductor light-emitting device shown in FIG. 3.

FIG. 3 is a cross-sectional view schematically illustrating an example of the group-III nitride semiconductor light-emitting device according to the present invention. FIG. 4 is a plan view schematically illustrating the group-III nitride semiconductor light-emitting device shown in FIG. 3.

As shown in FIG. 3, a light-emitting device 1 according to this embodiment is a one-plane electrode type in which a buffer layer 12 and a semiconductor layer 20 made of a group-III nitride semiconductor including Ga as a group-III element are formed on the substrate 11. As shown in FIG. 3, the semiconductor layer 20 has a laminated structure of an n-type semiconductor layer 14, a light-emitting layer 15, and a p-type semiconductor layer 16 formed in this order.

[Laminated Structure of Light-Emitting Device]

<Substrate>

In the light-emitting device 1 according to this embodiment, the substrate 11 may be formed of any material as long as a group-III nitride semiconductor crystal can be epitaxially grown on the surface of the substrate. For example, the substrate may be formed of sapphire, SiC, silicon, zinc oxide, magnesium oxide, manganese oxide, zirconium oxide, manganese zinc iron oxide, magnesium aluminum oxide, zirconium boride, gallium oxide, indium oxide, lithium gallium oxide, lithium aluminum oxide, neodymium gallium oxide, lanthanum strontium oxide, strontium titanium oxide, titanium oxide, hafnium, tungsten, or molybdenum.

<Buffer Layer>

In the light-emitting device 1 according to this embodiment, the buffer layer 12 having a hexagonal crystal structure is formed on the substrate 11.

It is preferable that the crystals of a group-III nitride semiconductor forming the buffer layer 12 have a single crystal structure. The crystals of the group-III nitride semiconductor are grown in both the upward direction and the in-plane direction to form a single crystal structure by controlling the deposition conditions. Therefore, it is possible to form the buffer layer 12 that is made of crystals of a group-III nitride semiconductor and has a single crystal structure by controlling the deposition conditions of the buffer layer 12.

When the buffer layer 12 having a single crystal structure is formed on the substrate 11, the buffer function of the buffer layer 12 works effectively, and the group-III nitride semiconductor formed on the buffer layer becomes a crystal film having good alignment and crystallinity.

It is possible to form a group-III nitride semiconductor that forms the buffer layer 12 and has columnar crystals (polycrystals) composed of a texture having a hexagonal column as a base by controlling the deposition conditions. The columnar crystals composed of the texture means crystals which have a columnar shape in a longitudinal sectional view and in which a crystal grain boundary is formed between adjacent crystal grains.

In the buffer layer 12, the average grain width of the grains of the columnar crystal is in the range of 0.1 to 100 nm, and it is preferable that the average grain width of the grains be in the range of 1 to 70 nm in terms of the buffer function. The grain width means the distance between the interfaces of crystals when the buffer layer 12 is an aggregation of columnar grains. When the grains are scattered in island shapes, the grain width means the diameter of the largest portion of the surface of a crystal grain contacting the surface of the substrate. In order to improve the crystallinity of a crystal layer of the group-III nitride semiconductor, it is necessary to appropriately control the grain width of the columnar crystals. Specifically, it is preferable that the grain width be in the above-mentioned range. In addition, it is preferable that the grains of crystals have a substantially columnar shape and the buffer layer 12 be an aggregate of columnar grains.

It is possible to easily measure the grain width of each columnar crystal using a cross-sectional TEM. In addition, it is difficult to accurately define the width of each columnar crystal, but the width distribution of the columnar crystals has a permitted limit. Therefore, for example, even when the grain width of several percent of columnar crystals is out of the above-mentioned range, the columnar crystals do not affect the effects of the present invention. It is preferable that 90% or more of columnar crystal have a grain width in the above-mentioned range.

The buffer layer 12 is preferably formed of a composition including Al, more preferably, a composition including AlN.

The buffer layer 12 may be formed of a group-III nitride semiconductor that is represented by the general formula AlGaInN. In addition, the buffer layer 12 may be formed of a group-V element, such as As or P. It is preferable that the buffer layer 12 be formed of GaAlN as a composition including Al. In this case, it is preferable that the content of Al be 50% or more.

The thickness of the buffer layer 12 is preferably in the range of 10 to 500 nm, more preferably, 20 to 100 nm.

If the thickness of the buffer layer 12 is less than 10 nm, a sufficient buffer function is not obtained. If the thickness of the buffer layer 12 is greater than 500 nm, there is no variation in the function of a coating layer, but it takes a long time to form the buffer layer, which results in low productivity. It is also possible to easily measure the thickness of the buffer layer 12 using the above-mentioned cross-sectional view TEM.

<Semiconductor Layer>

As shown in FIG. 3, the semiconductor layer 20 includes the n-type semiconductor layer 14, the light-emitting layer 15, and the p-type semiconductor layer 16.

<n-Type Semiconductor Layer>

The n-type semiconductor layer 14 is formed on the buffer layer 12, and includes an underlying layer 14a, an n-type contact layer 14b, and an n-type clad layer 14c. The n-type contact layer may also serve as the underlying layer and/or the n-type clad layer.

(Underlying Layer)

The underlying layer 14a of the n-type semiconductor layer 14 according to this embodiment is formed of a group-III nitride semiconductor.

The underlying layer 14a may be formed of the same material as that forming the buffer layer 12 or a material different from the material forming the buffer layer 12. The underlying layer 14a is preferably formed of a group-III nitride semiconductor including Ga, that is, a GaN compound semiconductor, more preferably, $Al_xGa_{1-x}N$ ($0 \leq x \leq 1$, preferably, $0 \leq x \leq 0.5$, more preferably, $0 \leq x \leq 0.1$).

For example, when the buffer layer 12 is formed of AlN, it is preferable to form a dislocation loop by migration such that the underlying layer 14a does not succeed to the crystallinity of the buffer layer 12. The GaN compound semiconductor is likely to generate the dislocation loop. In particular, AlGaN or GaN is preferable.

The thickness of the underlying layer 14a is preferably greater than 0.1 μm, more preferably, greater than 0.5 μm, most preferably, greater than 1 μm. If the thickness is greater than the above-mentioned range, it is easy to obtain an $Al_xGa_{1-x}N$ layer with high crystallinity.

The underlying layer 14a may be doped with an n-type dopant in the concentration range of $1 \times 10^{17}$ to $1 \times 10^{19}/cm^3$, if necessary, or the underlying layer 14a may be undoped (<$1 \times 10^{17}/cm^3$). It is preferable that the underlying layer 14a be undoped in order to maintain high crystallinity.

For example, when the substrate 11 has conductivity, it is possible to form electrodes on the upper and lower surfaces of the light-emitting device 1 by doping the underlying layer 14a with a dopant to have conductivity. When the substrate 11 is formed of an insulating material, it is possible to form a chip structure in which positive and negative electrodes are formed on the same surface of the light-emitting device 1. Therefore, it is preferable that a layer immediately above the substrate 11 be undoped in order to obtain high crystallinity.

For example, Si, Ge, and Sn, preferably, Si and Ge are used as the n-type dopant, but the present invention is not limited thereto.

(n-Type Contact Layer)

The n-type contact layer 14b is formed of a group-III nitride semiconductor. It is preferable that the n-type contact layer 14b be formed of $Al_xGa_{1-x}N$ ($0 \leq x \leq 1$, preferably, $0 \leq x \leq 0.5$, more preferably, $0 \leq x \leq 0.1$), similar to the underlying layer 14a. The n-type contact layer 14b is preferably doped with an n-type dopant in the concentration range of $1 \times 10^{17}$ to $1 \times 10^{19}/cm^3$, more preferably, $1 \times 10^{18}$ to $1 \times 10^{19}/cm^3$, in order to maintain good ohmic contact with the negative electrode, prevent the occurrence of cracks, and maintain high crystallinity. For example, Si, Ge, and Sn, preferably, Si and Ge are used as the n-type dopant, but the present invention is not limited thereto.

It is preferable that the gallium nitride compound semiconductors forming the underlying layer 14a and the n-type contact layer 14b have the same composition. The sum of the thicknesses of the underlying layer and the n-type contact layer is preferably in the range of 0.1 to 20 μM, preferably, 0.5 to 15 μm, most preferably, 1 to 12 μm.

When the thickness is in the above-mentioned range, it is possible to maintain the crystallinity of the semiconductor at a high level.

(n-Type Clad Layer)

It is preferable to provide the n-type clad layer 14c between the n-type contact layer 14b and the light-emitting layer 15. The n-type clad layer 14c makes it possible to restore the unevenness of the outer surface of the n-type contact layer 14b. The n-type clad layer 14c may be formed of, for example, AlGaN, GaN, or GaInN. In addition, a heterojunction structure of these layers or a superlattice structure of a plurality of layers may be used. When the n-type clad layer 14c is formed of GaInN, it is preferable that the band gap of GaInN of the n-type clad layer 14c be larger than that of GaInN of the light-emitting layer 15.

The thickness of the n-type clad layer 14c is not particularly limited, but is preferably in the range of 5 to 500 nm, more preferably, 5 to 100 nm.

The n-type dopant concentration of the n-type clad layer 14c is preferably in the range of $1 \times 10^{17}$ to $1 \times 10^{20}/cm^3$, more preferably, $1 \times 10^{18}$ to $1 \times 10^{19}/cm^3$.

If the dopant concentration is within the above-mentioned range, it is possible to maintain high crystallinity and reduce the driving voltage of a light-emitting device.

<Light-Emitting Layer>

As shown in FIG. 3, the light-emitting layer 15 is formed by alternately laminating barrier layers 15a made of a gallium nitride compound semiconductor and well layers 15b made of a gallium nitride compound semiconductor including indium, and the barrier layers 15a are arranged so as to contact the n-type semiconductor layer 14 and the p-type semiconductor layer 16. In the structure shown in FIG. 3, the light-emitting layer 15 includes six barrier layers 15a and five well layers 15b alternately formed, and the barrier layers 15a are arranged at the uppermost and lowermost sides of the light-emitting layer 15, and the well layer 15b is arranged between the barrier layers 15a.

The barrier layer 15a is preferably formed of, for example, a gallium nitride compound semiconductor, such as $Al_cGa_{1-c}N$ ($0 \leq c < 0.3$), having a band gap energy that is higher than that of the well layer 15b.

The well layer 15b may be formed of a gallium indium nitride, such as $Ga_{1-s}In_sN$ ($0 < s < 0.4$), as a gallium nitride compound semiconductor including indium.

The overall thickness of the light-emitting layer 15 is not particularly limited, but it is preferable that light-emitting layer 15 has a sufficient thickness to obtain a quantum effect, that is, a threshold thickness. For example, the thickness of the light-emitting layer 15 is preferably in the range of 1 to 500 nm, more preferably, about 100 nm. If the thickness is in the above-mentioned range, it is possible to improve emission power.

<p-Type Semiconductor Layer>

The p-type semiconductor layer 16 includes a p-type clad layer 16a and a p-type contact layer 16b. The p-type contact layer may also serve as the p-type clad layer.

(p-Type Clad Layer)

The p-type clad layer 16a may be formed of any material as long as the material has a band gap energy that is larger than that of the light-emitting layer 15 and can confine carriers in the light-emitting layer 15. The p-type clad layer 16a is preferably formed of $Al_dGa_{1-d}N$ ($0 < d \leq 0.4$, preferably, $0.1 \leq d \leq 0.3$). If the p-type clad layer 16a is formed of AlGaN, it is possible to confine carriers in the light-emitting layer 15.

The thickness of the p-type clad layer 16a is not particularly limited, but is preferably in the range of 1 to 400 nm, more preferably, 5 to 100 nm.

The p-type dopant concentration of the p-type clad layer 16a is preferably in the range of $1 \times 10^{18}$ to $1 \times 10^{21}/cm^3$, more preferably, $1 \times 10^{19}$ to $1 \times 10^{20}/cm^3$. If the p-type dopant concentration is in the above-mentioned range, it is possible to obtain good p-type crystals without lowering crystallinity. The p-type dopant is not particularly limited, but it is preferable that the p-type dopant be, for example, Mg.

(p-Type Contact Layer)

The p-type contact layer 16b is a gallium nitride compound semiconductor layer including at least $Al_eGa_{1-e}N$ ($0 \leq e < 0.5$, preferably, $0 \leq e \leq 0.2$, more preferably, $0 \leq e \leq 0.1$). If the content of Al is in the above-mentioned range, it is possible to maintain high crystallinity and obtain good ohmic contact with a p-type ohmic electrode (see a transparent positive electrode 17, which will be described below).

The thickness of the p-type contact layer 16b is not particularly limited, but is preferably in the range of 10 to 500 nm, more preferably, 50 to 200 nm. If the thickness is in the above-mentioned range, it is possible to maintain emission power at a high level.

The p-type dopant concentration of the p-type contact layer 16b is preferably in the range of $1 \times 10^{18}$ to $1 \times 10^{21}/cm^3$, more preferably, $5 \times 10^{19}$ to $5 \times 10^{20}/cm^3$ in order to maintain good ohmic contact, prevent the occurrence of cracks, and maintain high crystallinity. The p-type dopant is not particularly limited, but it is preferable that the p-type dopant be, for example, Mg.

The semiconductor layer 20 of the light-emitting device 1 according to the present invention is not limited to the above-described embodiment.

For example, various kinds of gallium nitride compound semiconductors other than the above-mentioned materials have been known which are represented by the general formula $Al_XGa_YIn_ZN_{1-A}M_A$ ($0 \leq X \leq 1$, $0 \leq Y \leq 1$, $0 \leq Z \leq 1$ and $X+Y+Z=1$. M indicates a V-group element different from nitrogen (N) and $0 \leq A < 1$). The present invention can also use any of the known gallium nitride compound semiconductors without any restrictions.

The group-III nitride semiconductor with Ga as a group III element may include group-III elements other than Al, Ga, and In, and it may include elements, such as Ge, Si, Mg, Ca, Zn, Be, P, and As, if necessary. In addition, it may include dopants, a raw material, and a very small amount of dopant contained in a reaction coil material that are necessarily contained depending on deposition conditions, in addition to the elements that are intentionally added.

<Transparent Positive Electrode>

The transparent positive electrode 17 is a transparent electrode formed on the p-type semiconductor layer 16.

The transparent positive electrode 17 may be formed of, for example, ITO ($In_2O_3$—$SnO_2$), AZnO (ZnO—$Al_2O_3$), IZO ($In_2O_3$—ZnO), or GZO (ZnO—$Ga_2O_3$), but the present invention is not limited thereto. In addition, the transparent positive electrode 17 may have any known structure, without any restrictions.

The transparent positive electrode 17 may be formed so as to cover the entire surface of the p-type semiconductor layer 16, or it may be formed in a lattice shape or a tree shape on the p-type semiconductor layer 16 with a gap therebetween.

<Positive Electrode Bonding Pad>

As shown in FIG. 4, a positive electrode bonding pad 18 is a substantially circular electrode that is provided on the transparent positive electrode 17.

The positive electrode bonding pad 18 may be formed of various known materials, such as Au, Al, Ni, and Cu. However, the known materials and the structure of the positive electrode bonding pad are not particularly limited.

It is preferable that the thickness of the positive electrode bonding pad 18 be in the range of 100 to 1000 nm. In addition, the bonding pad has characteristics that, as the thickness thereof increases, bondability is improved. Therefore, it is preferable that the thickness of the positive electrode bonding pad 18 be greater than or equal to 300 nm. In addition, it is preferable that the thickness of the positive electrode bonding pad be less than or equal to 500 nm in order to reduce manufacturing costs.

<Negative Electrode>

A negative electrode 19 comes into contact with the n-type contact layer 14b of the n-type semiconductor layer 14 of the semiconductor layer 20. Therefore, as shown in FIGS. 3 and 4, the negative electrode 19 is formed in a substantially circular shape on an exposed region 14d that is formed by partially removing the light-emitting layer 15, the p-type semiconductor layer 16, and the n-type semiconductor layer 14 to expose the n-type contact layer 14b.

The negative electrode 19 may be formed of any of the materials having various compositions and structures, without any restrictions.

[Method of Manufacturing Light-Emitting Device]

Figure 5:
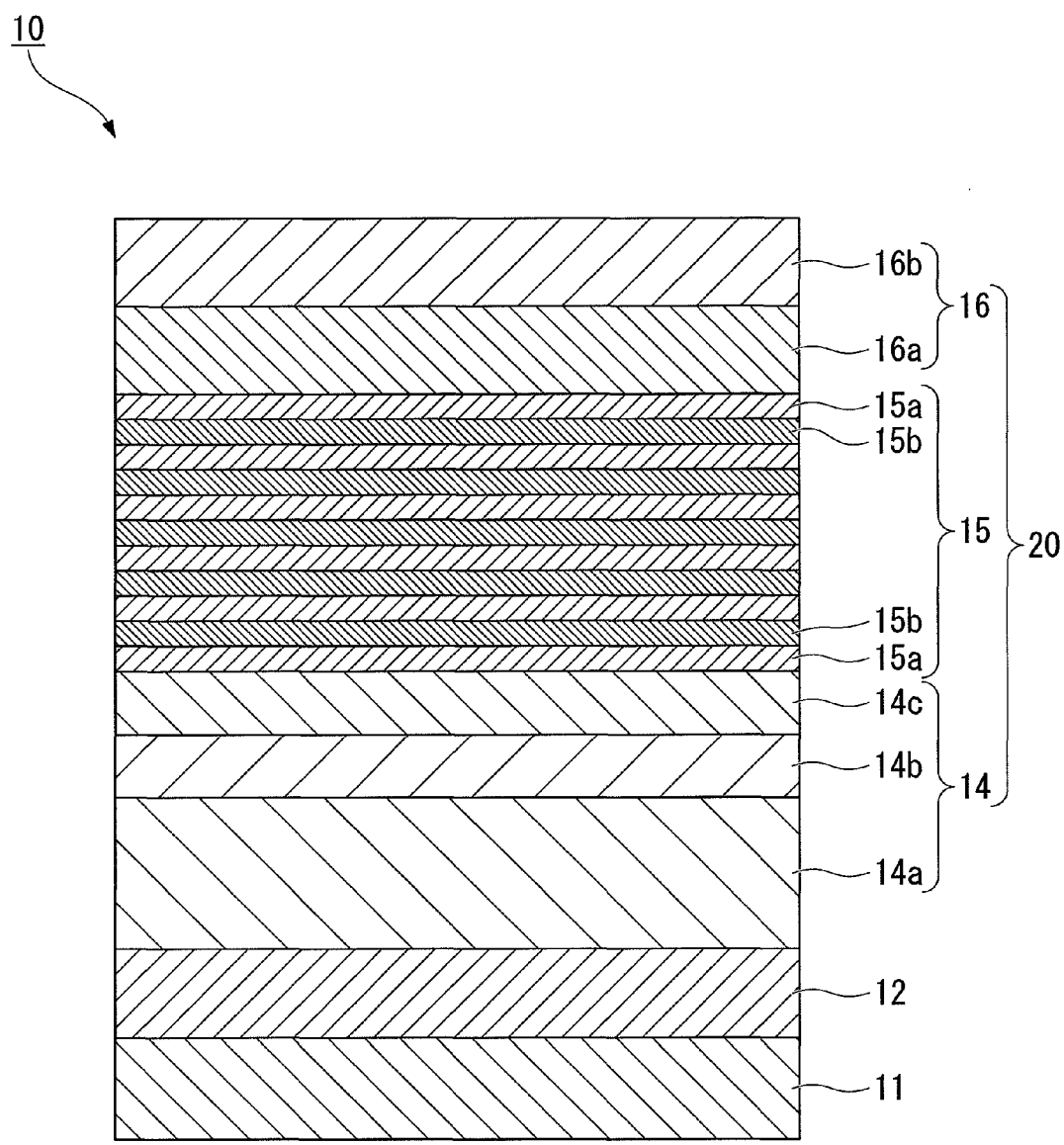
FIG. 5 is a cross-sectional view schematically illustrating a laminated semiconductor obtained by a method of manufacturing the group-III nitride semiconductor light-emitting device shown in FIG. 3.

In order to manufacture the light-emitting device 1 shown in FIG. 3, first, the semiconductor layer 20 is formed on the substrate 11 to form a laminated semiconductor 10 shown in FIG. 5. In order to form the laminated semiconductor 10 shown in FIG. 5, first, the buffer layer 12, the underlying layer 14a, and the n-type contact layer 14b are formed on the substrate 11 by the method of manufacturing a group-III nitride semiconductor layer using the sputtering apparatus 40 shown in FIG. 1.

In this embodiment, before the buffer layer 12 is formed on the substrate 11, a pre-process is performed on the substrate 11. The pre-process performed on the substrate 11 stabilizes a deposition process. For example, the pre-process may be performed on the substrate 11 by arranging the substrate 11 in the chamber 41 of the sputtering apparatus 40 and performing sputtering before the buffer layer 12 is formed. Specifically, it is possible to clean the surface of the substrate 11 by exposing the substrate 11 in an Ar gas or $N_2$ gas plasma in the chamber 41. It is possible to remove an organic material or an oxide adhered to the surface of the substrate 11 by exposing the substrate 11 in the Ar gas or $N_2$ gas plasma. In this case, a voltage is applied between the substrate 11 and the chamber 41 without supplying power to the target 47, to effectively clean the surface of the substrate 11 using plasma particles.

The pre-process performed on the substrate 11 is not limited to the above. However, for example, when a silicon substrate 11 is used, a wet method, such as an RCA cleaning method, may be used to hydrogen-terminate the surface of the substrate.

After the pre-process is performed on the substrate 11, the buffer layer 12, the underlying layer 14a, which is an undoped semiconductor layer, and the n-type contact layer 14b are sequentially formed on the substrate by the method of manufacturing a group-III nitride semiconductor layer using the sputtering apparatus 40 shown in FIG. 1.

Then, the n-type clad layer 14c of the n-type semiconductor layer 14, the light-emitting layer 15 including the barrier layers 15a and the well layers 15b, and the p-type clad layer 16a and the p-type contact layer 16b of the p-type semiconductor layer 16 are formed by a metal organic chemical vapor deposition (MOCVD) method which is effective to control the thickness of a film.

In the MOCVD method, hydrogen ($H_2$) or nitrogen ($N_2$) is used as a carrier gas, trimethylgallium (TMG) or triethylgallium (TEG) is used as a Ga source, which is a group-III element, trimethylaluminum (TMA) or triethylaluminum (TEA) is used as an Al source, trimethylindium (TMI) or triethylindium (TEI) is used as an In source, and ammonium ($NH_3$) or hydrazine ($N_2H_4$) is used as a nitrogen (N) source, which is a group-V element.

In addition, for example, Si-based materials, such as monosilane ($SiH_4$) and disilane ($Si_2H_6$), and Ge-based materials, that is, organic germanium compounds, such as germane ($GeH_4$), tetramethylgermanium ($(CH_3)_4Ge$), and tetraethylgermanium ($(C_2H_5)_4Ge$), may be used as n-type dopants.

Mg-based materials, such as bis-cyclopentadienylmagnesium ($Cp_2Mg$) and bisethylcyclopentadienyl magnesium ($EtCp_2Mg$), may be used as n-type dopants.

The transparent positive electrode 17 and the positive electrode bonding pad 18 are sequentially formed on the p-type contact layer 16b of the laminated semiconductor 10 shown in FIG. 5 by photolithography.

Then, dry etching is performed on the laminated semiconductor 10 having the transparent positive electrode 17 and the positive electrode bonding pad 18 formed thereon to expose the exposed region 14d from the n-type contact layer 14b.

Then, the negative electrode 19 is formed on the exposed region 14d by photolithography to obtain the light-emitting device 1 shown in FIGS. 3 and 4.

In the light-emitting device according to this embodiment, the underlying layer 14a and the n-type contact layer 14b of the n-type semiconductor layer 14 of the semiconductor layer 20 are formed by the method of manufacturing a group-III nitride semiconductor layer using the sputtering apparatus 40 shown in FIG. 1. Therefore, it is possible to obtain a group-III nitride semiconductor light-emitting device including the semiconductor layer 20 with high crystallinity.

In the light-emitting device according to this embodiment, the buffer layer 12 made of a group-III nitride semiconductor is formed between the substrate 11 and the n-type semiconductor layer 14 by the method of manufacturing a group-III nitride semiconductor layer using the sputtering apparatus 40 shown in FIG. 1. Therefore, it is possible to form the buffer layer 12 with high crystallinity. As such, when the buffer layer 12 with high crystallinity is formed below the n-type semiconductor layer 14, it is easy to form the n-type semiconductor layer 14 with high crystallinity on the buffer layer 12. Therefore, the light-emitting device according to this embodiment includes the semiconductor layer 20 with very high crystallinity.

In the light-emitting device 1 according to this embodiment, the underlying layer 14a and the n-type contact layer 14b of the n-type semiconductor layer 14 of the semiconductor layer 20 are formed by the method of manufacturing a group-III nitride semiconductor layer using the sputtering apparatus 40 shown in FIG. 1, but the present invention is not limited thereto. For example, at least a portion of the semiconductor layer 20 may be formed by the method of manufacturing a group-III nitride semiconductor layer according to the present invention.

For example, in this embodiment, the n-type clad layer 14c of the n-type semiconductor layer 14 and the p-type semiconductor layer 16 are formed by MOCVD, but the present invention is not limited thereto. The n-type clad layer 14c and the p-type semiconductor layer 16 may be formed by the method of manufacturing a group-III nitride semiconductor layer according to the present invention.

In the light-emitting device 1 according to this embodiment, at least a portion of the semiconductor layer 20 may be formed by the method of manufacturing a group-III nitride semiconductor layer according to the present invention. For example, the semiconductor layer 20 may be formed by a combination of the method of manufacturing a group-III nitride semiconductor layer according to the present invention and any known method of manufacturing a group-III nitride compound semiconductor, such as a sputtering method, an MOCVD (metal organic chemical vapor deposition) method, an HVPE (hydride vapor phase epitaxy) method, or an MBE (molecular beam epitaxy) method.

In this embodiment, the manufacturing method using the sputtering apparatus 40 shown in FIG. 1 is given as an example. However, instead of the manufacturing method using the sputtering apparatus 40 shown in FIG. 1, a method of manufacturing a group-III nitride semiconductor layer using the sputtering apparatus 50 shown in FIG. 2 may be used.

The method of manufacturing a group-III nitride semiconductor according to the present invention can be applied to manufacture, for example, photoelectric conversion devices, such as a laser device and a light-receiving device, and electronic devices, such as an HBT and a HEMT, in addition to the light-emitting device. Semiconductor devices having various structures have been known, and the structure of the group-III nitride semiconductor light-emitting device according to the present invention may include these known device structures.

[Lamp]

A lamp according to the present invention uses the light-emitting device according to the present invention.

For example, a lamp formed by combining the light-emitting device according to the present invention with a phosphor can be given as an example of the lamp according to the present invention. The lamp formed by combining the light-emitting device with the phosphor may be configured to have a known structure by a known means. In addition, a technique for combining a light-emitting device with a phosphor to change the color of emission light has been known, and the lamp according to the present invention can adopt the technique without any restrictions.

For example, it is possible to emit light having a long wavelength from the light-emitting device by appropriately selecting the phosphor used for the lamp. In addition, it is possible to achieve a lamp emitting white light by mixing the emission wavelength of the light-emitting device and a wavelength converted by the phosphor.

Figure 6:
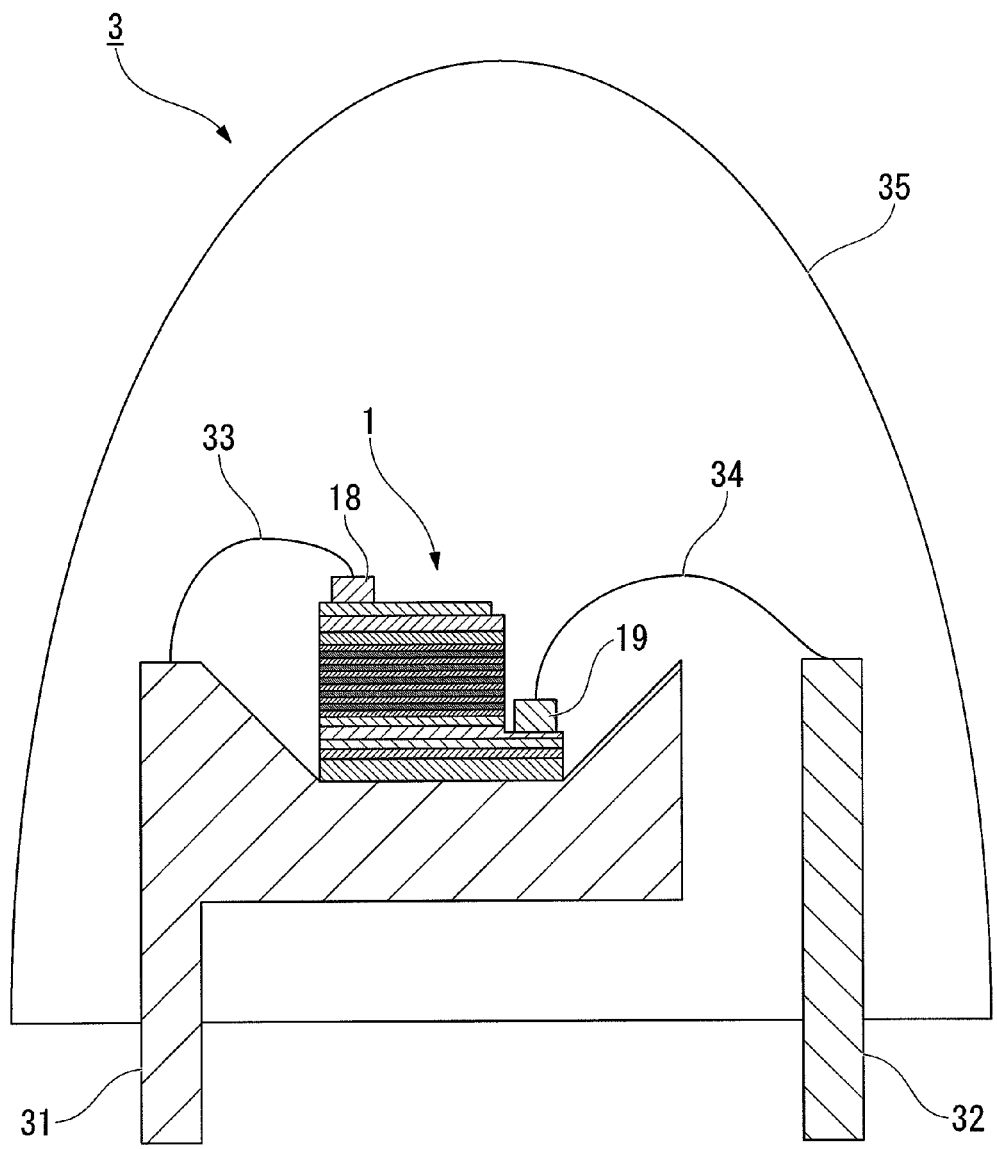
FIG. 6 is a diagram schematically illustrating an example of a lamp including the group-III nitride semiconductor light-emitting device according to the present invention.

FIG. 6 is a diagram schematically illustrating an example of the lamp using the group-III nitride semiconductor light-emitting device according to the present invention. A lamp 3 shown in FIG. 6 is a bomb-shaped lamp, and uses the light-emitting device 1 shown in FIG. 3. As shown in FIG. 6, the positive electrode bonding pad (see reference numeral 18 in FIG. 4) of the light-emitting device 1 is bonded to one (a frame 31 in FIG. 5) of two frames 31 and 32 by a wire 33, and the negative electrode (see reference numeral 19 in FIG. 4) of the light-emitting device 1 is bonded to the other frame 32 by a wire 34. In this way, the light-emitting device 1 is mounted to the frames.

The periphery of the light-emitting device 1 is sealed by a mold 35 made of a transparent resin.

Since the lamp according to the present invention uses the light-emitting device according to the present invention, the lamp has high emission efficiency.

In addition, the light-emitting device according to the present invention may be used for various types of lamps, such as a general-purpose bullet-shaped lamp, a side view lamp for a backlight of a portable device, and a top view lamp used for a display device.

EXAMPLES

Next, the present invention will be described in detail with reference to Examples and Comparative examples, but the present invention is not limited thereto.

Example 1

The light-emitting device 1 shown in FIGS. 3 and 4 was manufactured by a manufacturing method using the sputtering apparatus 40 shown in FIG. 1 as follows.

First, the buffer layer 12 made of AlN having a single crystal structure was formed on the c-plane of the substrate 11 made of sapphire using the sputtering apparatus 40 shown in FIG. 1, and the underlying layer 14a, which was an undoped GaN layer, of the n-type semiconductor layer 14 and the n-type contact layer 14b, which was a Si-doped GaN layer, of the n-type semiconductor layer 14 were sequentially formed on the buffer layer.

Specifically, a 2-inch sapphire substrate 11 whose one surface was polished into a mirror surface suitable for epitaxial growth was prepared, and the substrate 11 was provided in the chamber 41 of the sputtering apparatus 40 shown in FIG. 1, without being subjected to a pre-process, such as a wet process. The sputtering apparatus 40 that had a radio frequency (RF) power supply and a mechanism capable of changing the position of a magnet in the target 47 made of Al was used. The substrate 11 was heated up to a temperature of 500° C. in the chamber 41 and only nitrogen gas was introduced into the chamber at a flow rate of 15 sccm to maintain the internal pressure of the chamber 41 at 1 Pa. Then, a high-frequency bias of 50 W was applied to the substrate 11 to generate nitrogen plasma, thereby cleaning the surface of the substrate 11.

Then, the atmosphere of the chamber 41 was changed to an argon gas atmosphere while maintaining the temperature of the substrate 11 at 500° C. (pre-process).

(1) Thereafter, argon gas was introduced into the chamber 41 at a flow rate of 5 sccm to maintain the argon atmosphere in the chamber 41 at a pressure of 0.5 Pa. Then, an RF power of 1 W/cm$^2$ was supplied to the target 47 made of Al to generate the first plasma P1 including Al particles, thereby forming an Al thin film on the substrate 11 for about 5 seconds (first plasma generating process). The thickness of the Al thin film was 0.8 nm.

(2) Then, the supply of the RF power to the target 47 was stopped to stop the supply of argon gas to the chamber 41, and an RF power of 100 W was supplied to the 2-inch substrate 11 to start the supply of nitrogen gas to the substrate 11 (first-second gas changing process). The first-second gas changing process was performed for one second such that the internal pressure of the chamber 41 was higher than 0.1 Pa and plasma was not removed.

(3) Then, the internal pressure of the chamber 41 was set to 1.0 Pa, and the second plasma P2 including a nitrogen element was supplied onto the substrate 11 at a temperature of the substrate 11 of 800° C. for 5 seconds, while the flow rate of nitrogen was maintained at 15 sccm and the RF power supplied to the substrate 11 was maintained at 100 W (second plasma generating process).

(4) Then, the supply of nitrogen gas into a furnace stopped, and the supply of argon gas into the chamber 41 started (second-first gas changing process). The second-first gas changing process was performed at a temperature of the substrate 11 of 800° C. at a pressure of 0.2 Pa for one second while an RF power of 20 W was supplied to the substrate 11, such that the plasma was not removed.

Then, the processes (1) to (4) were repeated 41 times, and finally, the processes (1) to (3) were performed one time to form the buffer layer 12 that was made of AlN and had a thickness of 40 nm on the c-plane of the substrate 11. After the buffer layer was formed, the generation of plasma in the chamber 41 stopped, and the temperature of the substrate 11 was reduced to room temperature. The deposition speed of the buffer layer 12 formed by the first plasma generating process and the second plasma generating process was 5 nm/min.

Then, the substrate 11 having the buffer layer 12 formed thereon was taken out from the chamber 41 of the sputtering apparatus 40, and then transported to the chamber 41 of another sputtering apparatus 40 having the same structure. The sputtering apparatus 40 for forming the underlying layer 14a of the n-type semiconductor layer 14 was provided with a target 47 made of Ga and a pipe for supplying a cooling medium to the target 47. Therefore, the sputtering apparatus supplied a cooling medium cooled down to a temperature of 20° C. through the pipe while the underlying layer 14a was formed, thereby preventing Ga from being melted due to heat.

Before the underlying layer 14a was formed, the surface of the substrate 11 having the buffer layer 12 formed thereon was cleaned by the same method as that cleaning the substrate 11 without the buffer layer 12 formed thereon. Then, the temperature of the substrate 11 was increased up to 950° C. to change the atmosphere in the chamber 41 to an argon gas atmosphere (pre-process).

(5) Thereafter, argon gas was introduced into the chamber 41 at a flow rate of 5 sccm, and the internal pressure of the chamber 41 was maintained at 0.5 Pa in the argon atmosphere. In addition, an RF power of 0.5 W/cm² was applied to the target 47 made of Ga to generate the first plasma including Ga particles, thereby forming a Ga thin film on the substrate 11 for about 5 seconds (first plasma generating process). As a result, the thickness of the Ga thin film was 3.4 nm.

(6) Then, the supply of the RF power to the target 47 was stopped to stop the supply of argon gas into the chamber 41, and an RF power of 100 W was supplied to the 2-inch substrate 11 to start the supply of nitrogen gas to the substrate 11 (first-second gas changing process). The first-second gas changing process was performed for one second such that the internal pressure of the chamber 41 was higher than 0.05 Pa and plasma was not removed.

(7) Then, the internal pressure of the chamber 41 was set to 1.0 Pa, and the second plasma including a nitrogen element was supplied onto the substrate 11 at a temperature of the substrate 11 of 900° C. for 5 seconds, while the flow rate of nitrogen was maintained at 15 sccm and the RF power supplied to the substrate 11 was maintained at 100 W (second plasma generating process).

(8) Then, the supply of nitrogen gas into a furnace stopped, and the supply of argon gas into the chamber 41 started (second-first gas changing process). The second-first gas changing process was performed at a temperature of the substrate 11 of 900° C. at a pressure of 0.2 Pa for one second while an RF power of 20 W was supplied to the substrate 11 such that the plasma was not removed.

Then, the processes (5) to (8) were repeated 1499 times, and finally, the processes (5) to (7) were performed one time to form the underlying layer 14a that was made of GaN with a thickness of 6 μm on the buffer layer 12. After the underlying layer was formed, the generation of plasma in the chamber 41 was stopped, and the temperature of the substrate 11 was reduced to room temperature. The deposition speed of the underlying layer 14a formed by the first plasma generating process and the second plasma generating process was 20 nm/min.

The X-ray rocking curve (XRC) of the undoped GaN layer (underlying layer 14a) was measured by an X-ray diffractometer (PANalytical's X' pert; four-crystal X-ray diffractometer). In the measuring process, a Cuβ-line X-ray generator was used as a light source and measurement was performed for (0002) planes, which were symmetric planes and (10-10) planes, which were asymmetric planes. Generally, in the case of a group-III nitride compound semiconductor, the half width of the XRC spectrum of the (0002) plane is used as an index for the flatness (mosaicity) of crystals and the half width of the XRC spectrum of the (10-10) plane is used as an index for the dislocation density (twist). As a result of the measurement of the X-ray rocking curve (XRC), the (0002) plane of the underlying layer 14a formed by the manufacturing method according to Example 1 had a half width of 30 arcseconds and the (10-10) plane thereof had a half width of 400 arcseconds.

Figure 7:
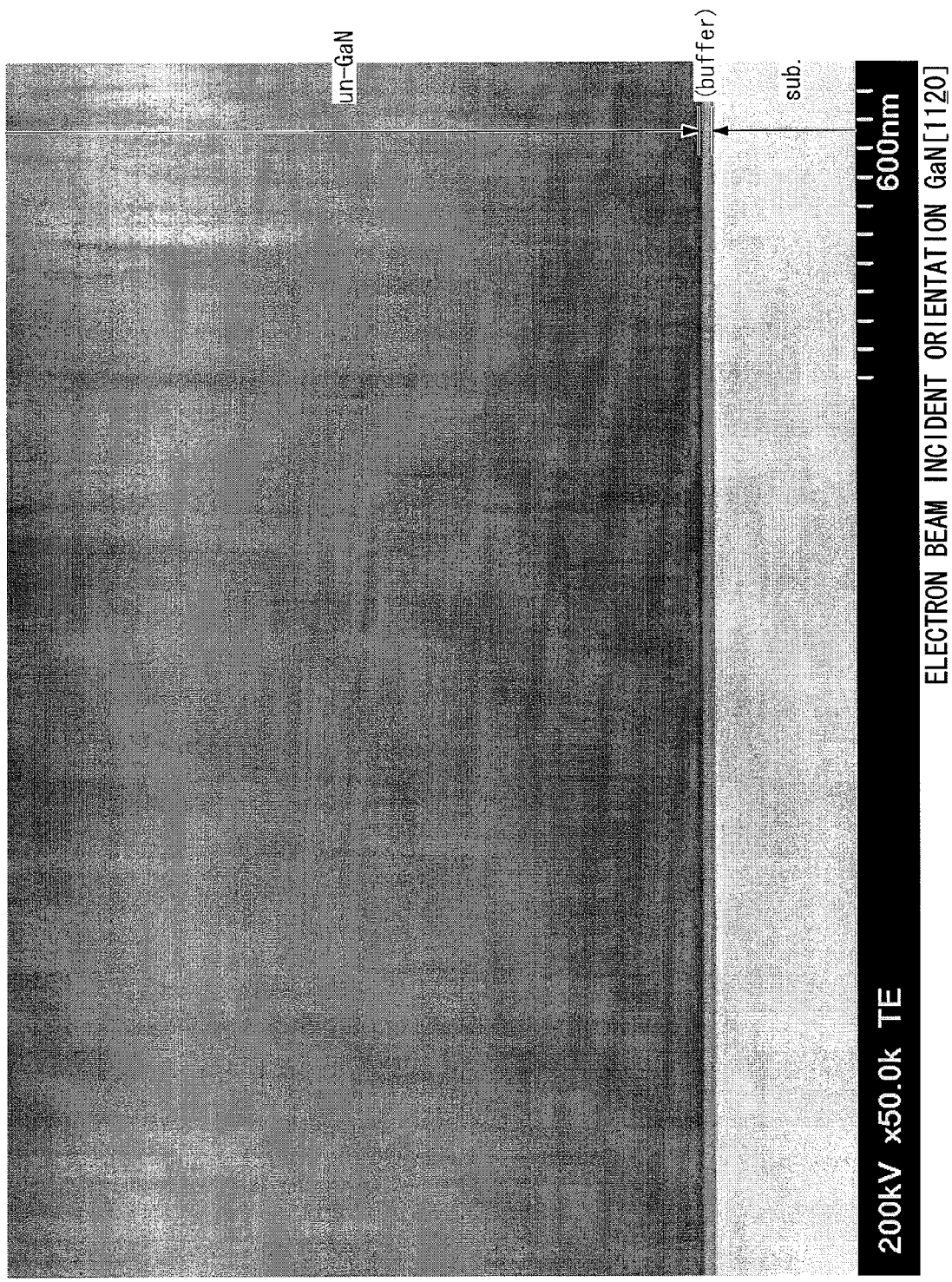
FIG. 7 is a TEM photograph illustrating the cross-section of a substrate, a buffer layer, and an underlying layer according to Example 1.

The cross-section of the substrate 11 having the underlying layer 14a formed thereon by the manufacturing method according to Example 1 was observed by a transmission electron microscope (TEM). The observation results are shown in FIG. 7. FIG. 7 is a TEM photograph illustrating the cross-section of the substrate 11 (sub) according to Example 1 having the underlying layer 14a formed thereon, the buffer layer 12 (buffer), and the underlying layer 14a (un-GaN) of the n-type semiconductor layer 14.

As shown in FIG. 7, stripe-shaped laminated structures arranged at intervals of 3 to 100 nm were observed from the underlying layer.

Then, the substrate 11 having the underlying layer 14a formed thereon was taken out from the chamber 41 of the sputtering apparatus 40 and then transported to the chamber 41 of another sputtering apparatus 40 having the same structure. The sputtering apparatus 40 used to form the n-type contact layer 14b had the same structure as that of the sputtering apparatus 40 for forming the underlying layer 14a except that a material obtained by providing a Si piece on a Ga target was used as the target 47.

The n-type contact layer 14b was formed as follows. Under the same conditions as those used for forming the underlying layer 14a, the processes (5) to (8) were repeated 500 times, and finally, the processes (5) to (7) were performed one time to form the n-type contact layer 14b that had an electron concentration of $1 \times 10^{19}$ cm$^{-3}$ and was made of Si-doped GaN with a thickness of 2 μm on the substrate 11 having the underlying layer 14a formed thereon. After the n-type contact layer was formed, the generation of plasma in the chamber 41 was stopped, and the temperature of the substrate 11 was reduced to room temperature. The deposition speed of the n-type contact layer 14b formed by the first plasma generating process and the second plasma generating process was 20 nm/min.

The substrate 11 having the n-type contact layer 14b formed thereon according to Example 1 had a colorless transparent mirror surface.

Then, the substrate 11 having the n-type contact layer 14b formed thereon was put into an MOCVD furnace, and various layers forming the semiconductor layer 20 were formed on the n-type contact layer 14b to obtain the laminated semiconductor 10 shown in FIG. 5.

The laminated semiconductor 10 had a laminated structure in which the buffer layer 12 that was made of AlN with a thickness of 40 nm, the underlying layer 14a that was made of undoped GaN with a thickness of 6 the n-type contact layer 14b that had an electron concentration of $1 \times 10^{19}$ cm$^{-3}$ and was made of Si-doped GaN with a thickness of 2 an $In_{0.1}Ga_{0.9}$ n-type clad layer (n-type clad layer 14c) that had an electron concentration of $1 \times 10^{18}$ cm$^{-3}$ and a thickness of 20 nm, the light-emitting layer 15 having a multiple quantum well structure, and the p-type semiconductor layer 16 were sequentially formed on the sapphire substrate 11 having a c-plane. The light-emitting layer 15 having a multiple quantum structure had a laminated structure in which GaN barrier layers were arranged as the uppermost and lowermost layers and six GaN barrier layers 15a each having a thickness of 16 nm and five undoped $In_{0.2}Ga_{0.8}N$ well layers 15b each having a thickness of 3 nm were alternately laminated. The p-type semiconductor layer 16 was formed by laminating a Mg-doped p-type $Al_{0.1}Ga_{0.9}N$ clad layer 16a with a thickness of 5 nm and a Mg-doped p-type $Al_{0.02}Ga_{0.98}N$ contact layer 16b with a thickness of 200 nm.

The Mg-doped p-type $Al_{0.02}Ga_{0.98}N$ contact layer 16b of the laminated semiconductor 10 showed p-type characteristics without being subjected to an annealing process for activating p-type carriers.

Then, the laminated semiconductor 10 was used to manufacture the light-emitting device 1 shown in FIGS. 3 and 4.

First, the transparent positive electrode 17 made of ITO and the positive electrode bonding pad 18 having a laminated structure of Ti, Al, and Au layers formed in this order from the surface of the transparent positive electrode 17 were sequentially formed on the surface of the p-type contact layer 16b of the laminated semiconductor 10 by a known photolithography method.

Then, dry etching was performed on the laminated semiconductor 10 having the transparent positive electrode 17 and the positive electrode bonding pad 18 formed thereon to expose the exposed region 14d from the n-type contact layer 14b. Then, the negative electrode 19 having a four-layer structure of Ni, Al, Ti, and Au layers was formed on the exposed region 14d by the photolithography method, thereby obtaining the light-emitting device 1 shown in FIGS. 3 and 4.

The rear surface of the substrate 11 of the obtained light-emitting device 1 was ground or polished into a mirror surface, and then cut into individual square chips each having a 350 μm square. Then, the chip was mounted to a lead frame with each electrode facing upward, and then connected to the lead frame by gold wires, thereby obtaining a light-emitting diode.

A forward current of 20 mA was applied between the positive electrode bonding pad 18 and the negative electrode 19 of the light-emitting diode to measure a forward voltage. As a result, the forward voltage was 3.0 V. In addition, an emission state was observed through the p-side transparent positive electrode 17. As the result, an emission wavelength was 470 nm and emission power was 15 mW. The emission characteristics of the light-emitting diode were obtained from substantially the entire surface of a manufactured wafer, without any variation.

Example 2

The light-emitting device 1 shown in FIGS. 3 and 4 was manufactured by a manufacturing method using the sputtering apparatus 50 shown in FIG. 2 as follows.

First, the buffer layer 12 made of AlN having a single crystal structure was formed on the c-plane of the substrate 11 made of sapphire using the sputtering apparatus 50 shown in FIG. 2, and the underlying layer 14a, which was an undoped GaN layer, of the n-type semiconductor layer 14 and the n-type contact layer 14b, which was a Si-doped GaN layer, of the n-type semiconductor layer 14 were sequentially formed on the buffer layer.

Specifically, four 2-inch sapphire substrates 11 each having one surface that was polished into a mirror surface suitable for epitaxial growth were prepared, and the substrates 11 were supported by the rotary tool 43 of the sputtering apparatus 50 shown in FIG. 2, without being subjected to a pre-process, such as a wet process, and arranged in the target chambers 61 and the nitrogen chambers 62. The sputtering apparatus 50 that had a radio frequency (RF) power supply and a mechanism capable of changing the position of a magnet in the target 47 made of Al was used.

The substrates 11 were heated up to a temperature of 500° C. in the nitrogen chambers 62 and only nitrogen gas was introduced into the nitrogen chambers at a flow rate of 15 sccm to maintain the internal pressure of the nitrogen chambers 62 at 1 Pa. Then, a high-frequency bias of 50 W was applied to the substrates 11 to generate nitrogen plasma, thereby cleaning the surfaces of the substrates 11 arranged in the nitrogen chambers 62.

In addition, argon gas was introduced into the target chambers 61 to change the atmosphere in the target chambers 61 to an argon gas atmosphere (first pre-process). In this case, the rotary tool 43 was rotated to move the substrates 11 arranged in the target chambers 61 to the nitrogen chambers 62 and move the substrates 11 arranged in the nitrogen chambers 62 to the target chambers 61.

Then, argon gas was introduced into the target chambers 61 at a flow rate of 5 sccm to maintain the argon atmosphere in the target chambers 61 at a pressure of 0.5 Pa. Then, an RF power of 1 W/cm$^2$ was supplied to the target 47 made of Al to generate the first plasma P1 including Al particles, thereby forming an Al thin film on the substrate 11 for about 5 seconds (first plasma generating process in an initial stage). The thickness of the Al thin film was 0.8 nm.

While the first plasma generating process was performed at the beginning, nitrogen gas was introduced into the nitrogen chambers 62 as a second pre-process to clean the substrates 11 in the nitrogen chambers 62 by the same method as described above.

After the first plasma generating process was performed at the beginning, the rotary tool 43 was rotated to move the substrates 11 arranged in the target chambers 61 to the nitrogen chambers 62 (first moving process), and move the substrates 11 arranged in the nitrogen chambers 62 to the target chambers 61.

Then, nitrogen gas was supplied into the nitrogen chambers 62 at a flow rate of 5 sccm to set the internal pressure of the nitrogen chambers 62 at 0.5 Pa, and an RF power of 100 W was applied to the substrates 11 to supply the second plasma P2 including a nitrogen element to the substrates 11 at a temperature of the substrate 11 of 800° C. for 5 seconds, thereby nitrifying the Al films formed on the substrates 11 in the nitrogen chambers 62 by the first plasma generating process (second plasma generating process in an initial stage).

While the second plasma generating process was performed at the beginning, the first plasma generating process was performed on the substrates 11 in the target chambers 61 that had been arranged in the nitrogen chambers 62 during the first plasma generating process in the initial stage.

Then, after the second plasma generating process was performed at the beginning, the rotary tool 43 was rotated at a rotational speed where the first plasma generating process and the second plasma generating process were repeated at a time interval of 5 seconds to move the substrates 11 arranged in the target chambers 61 to the nitrogen chambers 62, and move the substrates 11 arranged in the nitrogen chambers 62 to the target chambers 61. Then, the first plasma generating process was performed on the substrates 11 in the target chambers 61, and the second plasma generating process was performed on the substrates 11 in the nitrogen chambers 62.

In this way, the substrates 11 made 21 revolutions in the chamber 60, and each of the first plasma generating process and the second plasma generating process was performed 40 times on the substrates 11 to form the buffer layer 12 that was made of AlN with a thickness of 40 nm on each of the c-planes of the substrates 11. After the buffer layer was formed, the temperature of the substrates 11 was reduced to room temperature. The deposition speed of the buffer layer 12 formed by the first plasma generating process and the second plasma generating process was 6 nm/min.

Then, the substrates 11 having the buffer layers 12 formed thereon were detached from the rotary tool 43 of the sputtering apparatus 50, and then supported by the rotary tool 43 of another sputtering apparatus 50 having the same structure. The sputtering apparatus 50 for forming the underlying layer 14a of the n-type semiconductor layer 14 was provided with the target 47 made of Ga and a pipe for supplying a cooling medium to the target 47. Therefore, the sputtering apparatus supplied a cooling medium cooled down to a temperature of 20° C. through the pipe while the underlying layer 14a was formed, thereby preventing Ga from being melted due to heat.

Before the underlying layer 14a was formed, the surface of the substrate 11 having the buffer layer 12 formed thereon was cleaned by the same method as that cleaning the substrate 11 without the buffer layer 12 formed thereon.

Then, the underlying layer 14a was performed by the same method as that forming the buffer layer 12 except for the following manufacturing conditions. That is, in the first plasma generating process, an RF power of 0.5 W/cm$^2$ was supplied to the target 47 made of Ga and argon gas was introduced at a flow rate of 20 sccm. In addition, in the second plasma generating process, the temperature of the substrate 11 was set to 950° C. The total number of rotations of the substrate 11 in the chamber 60 was set to 750.

The underlying layer 14a made of GaN was formed with a thickness of 6 μm on the substrate 11 having the buffer layer 12 formed thereon. After the underlying layer was formed, the temperature of the substrate 11 was reduced to room temperature. The deposition speed of the underlying layer 14a formed by the first plasma generating process and the second plasma generating process was 24 nm/min. In addition, the thickness of the Ga thin film formed by one first plasma generating process was 3.4 nm.

The X-ray rocking curve (XRC) of the undoped GaN layer (underlying layer 14a) was measured by the same method as that in Example 1.

As a result of the measurement of the X-ray rocking curve (XRC), the (0002) plane of the undoped GaN layer formed by the manufacturing method according to Example 2 had a half width of 25 arcseconds and the (10-10) plane thereof had a half width of 450 arcseconds.

Then, the substrates 11 having the underlying layers 14a formed thereon were detached from the rotary tool 43 of the sputtering apparatus 50, and then supported by the rotary tool 43 of another sputtering apparatus 50 having the same structure. The sputtering apparatus 50 for forming the n-type contact layer 14b had the same structure as the sputtering apparatus 50 for forming the underlying layer 14a except that a target 47 having a Si piece formed on a Ga target was used.

The n-type contact layer 14b was formed as follows. The n-type contact layer 14b that had an electron concentration of $1\times10^{19}$ cm$^{-3}$ and was made of Si-doped GaN with a thickness of 2 μm was formed on the substrate 11 having the underlying layer 14a formed thereon under the same conditions as those used for forming the underlying layer 14a except the total number of rotations of the substrate 11 in the chamber 60 was 250. After the n-type contact layer was formed, the temperature of the substrate 11 was reduced to room temperature. The deposition speed of the n-type contact layer 14b formed by the first plasma generating process and the second plasma generating process was 24 nm/min.

The substrate 11 having the n-type contact layer 14b formed thereon according to Example 2 had a colorless transparent mirror surface.

Then, the substrate 11 having the n-type contact layer 14b formed thereon was put into an MOCVD furnace, and various layers forming the semiconductor layer 20 were formed on the n-type contact layer 14b to obtain the laminated semiconductor 10 shown in FIG. 5, similar to Example 1.

The Mg-doped p-type 0Al$_{0.02}$Ga$_{0.98}$N contact layer 16b of the laminated semiconductor 10 showed p-type characteristics without being subjected to an annealing process for activating p-type carriers.

Then, the laminated semiconductor 10 was used to manufacture the light-emitting device 1 shown in FIGS. 3 and 4 by the same method as that in Example 1. Then, the obtained light-emitting device 1 was used to manufacture a light-emitting diode by the same method as that in Example 1.

A forward current of 20 mA was applied between the positive electrode bonding pad 18 and the negative electrode 19 of the light-emitting diode to measure a forward voltage.

As a result, the forward voltage was 3.05 V. In addition, an emission state was observed through the p-side transparent positive electrode 17. As a result, the emission wavelength was 470 nm and emission power was 15.5 mW. The emission characteristics of the light-emitting diode were obtained from substantially the entire surface of a manufactured wafer, without any variation.

Example 3

A sputtering apparatus having the same structure as the sputtering apparatus 50 shown in FIG. 2 except that it was provided with a second plasma generating means generating a second plasma including a nitrogen element using inductively coupled plasma (ICP) was used to manufacture the light-emitting device 1 shown in FIGS. 3 and 4, as follows.

First, the sputtering apparatus was used to sequentially form the buffer layer 12 made of AlN having a single crystal structure, the underlying layer 14a, which was an undoped GaN layer, of the n-type semiconductor layer 14, and the n-type contact layer 14b, which was a Si-doped GaN layer, of the n-type semiconductor layer 14 on the c-plane of the sapphire substrate 11.

In Example 3, the buffer layer 12 made of AlN having a single crystal structure was formed by the same method as that in Example 2 except for the second plasma generating process. That is, in the second plasma generating process according to Example 3, an RF power of 500 W was applied to the inductively coupled plasma (ICP) to supply the second plasma P2 including a nitrogen element to the substrate 11, unlike Example 2 in which the RF power was applied to the substrate 11. In this way, the buffer layer 12 made of AlN was formed with a thickness of 40 nm on the c-plane of the substrate 11.

Then, in the second plasma generating process, the underlying layer 14a made of GaN was formed with a thickness of 6 μm by the same method as that in Example 2 except that an RF power of 500 W was applied to the inductively coupled plasma (ICP), instead of supplying the RF power to the substrate 11.

The X-ray rocking curve (XRC) of the undoped GaN layer (underlying layer 14a) was measured by the same method as that in Example 1.

As a result of the measurement of the X-ray rocking curve (XRC), the (0002) plane of the undoped GaN layer formed by the manufacturing method according to Example 3 had a half width of 25 arcseconds and the (10-10) plane thereof had a half width of 450 arcseconds.

Then, the n-type contact layer 14b that had an electron concentration of $1\times10^{19}$ cm$^{-3}$ and was made of Si-doped GaN with a thickness of 2 μm was formed on the substrate 11 having the underlying layer 14a formed thereon by the same method as that in Example 2 except that an RF power of 500 W was applied to the inductively coupled plasma (ICP), instead of supplying the RF power to the substrate 11. The substrate 11 having the n-type contact layer 14b formed thereon according to Example 3 had a colorless transparent mirror surface.

Then, the substrate 11 having the n-type contact layer 14b formed thereon was put into an MOCVD furnace, and various layers forming the semiconductor layer 20 were formed on the n-type contact layer 14b to obtain the laminated semiconductor 10 shown in FIG. 5, similar to Example 1.

The Mg-doped p-type $Al_{0.02}Ga_{0.98}N$ contact layer 16b of the laminated semiconductor 10 showed p-type characteristics without being subjected to an annealing process for activating p-type carriers.

Then, the laminated semiconductor 10 was used to manufacture the light-emitting device 1 shown in FIGS. 3 and 4 by the same method as that in Example 1. Then, the obtained light-emitting device 1 was used to manufacture a light-emitting diode by the same method as that in Example 1.

A forward current of 20 mA was applied between the positive electrode bonding pad 18 and the negative electrode 19 of the light-emitting diode to measure a forward voltage. As a result, the forward voltage was 3.05 V. In addition, an emission state was observed through the p-side transparent positive electrode 17. As the result, an emission wavelength was 470 nm and emission power was 15.5 mW. The emission characteristics of the light-emitting diode were obtained from substantially the entire surface of a manufactured wafer, without any variation.

Comparative Example 1

The light-emitting device 1 shown in FIGS. 3 and 4 was manufactured by a manufacturing method using the sputtering apparatus 40 according to the related art as follows.

First, the buffer layer 12 made of AlN was formed on the c-plane of the substrate 11 made of sapphire, and the underlying layer 14a, which was an undoped GaN layer, of the n-type semiconductor layer 14 and the n-type contact layer 14b, which was a Si-doped GaN layer, of the n-type semiconductor layer 14 were sequentially formed on the buffer layer using the sputtering apparatus according to the related art.

First, the sapphire substrate 11 having one surface that was polished into a mirror surface suitable for epitaxial growth was prepared, and the substrate 11 was put into the sputtering apparatus, without being subjected to a pre-process, such as a wet process. The sputtering apparatus that had a radio frequency (RF) power supply and a mechanism capable of changing the position of a magnet in a target made of Al was used. The substrate 11 was heated up to a temperature of 750° C. in the sputtering apparatus and nitrogen gas was introduced into a chamber at a flow rate of 15 sccm to maintain the internal pressure of the chamber at 1 Pa. Then, a high-frequency bias of 50 W was applied to the substrate 11 to generate nitrogen plasma, thereby cleaning the surfaces of the substrate 11.

Then, argon gas and nitrogen gas were introduced into the chamber of the sputtering apparatus while maintaining the temperature of the substrate 11. Then, the buffer layer 12 made of AlN was formed with a thickness of 40 nm on the substrate 11 made of sapphire under the following conditions: a high-frequency bias of 2000 W was applied to the Al target; the internal pressure of a furnace was maintained at 0.5 Pa; Ar gas was introduced at a flow rate of 5 sccm; and nitrogen gas was introduced at a flow rate of 15 sccm (the content of nitrogen gas was 75%). The deposition speed of the buffer layer 12 was 5 nm/min. After the buffer layer 12 was formed, the generation of plasma was stopped, and the temperature of the substrate 11 was reduced. In addition, the magnet in the target was tilted both during the cleaning of the substrate 11 and during the deposition of the layer.

Then, the underlying layer 14a made of GaN was formed with a thickness of 6 μm on the substrate 11 having the buffer layer 12 formed thereon. The underlying layer 14a was formed by the same method as that forming the buffer layer 12 except for the following deposition conditions. First, the substrate 11 was heated up to 900° C. in the chamber of the sputtering apparatus, and then argon gas and nitrogen gas were introduced into the chamber. Then, a high-frequency power of 2000 W was supplied to the Ga target to maintain the internal pressure of the furnace at 1.0 Pa, and Ar gas and nitrogen gas were introduced into the chamber at flow rates of 25 sccm and 15 sccm, respectively. The deposition speed of the underlying layer 14a was 20 nm/min.

Then, the n-type contact layer 14b made of GaN was formed with a thickness of 2 μm on the substrate 11 having the underlying layer 14a formed thereon. The n-type contact layer 14b was formed by the same method as that forming the underlying layer 14a except that a material having a Si piece formed on a Ga target was used as a target.

The X-ray rocking curve (XRC) of the undoped GaN layer (underlying layer 14a) was measured by the same method as that in Example 1.

As a result of the measurement of the X-ray rocking curve (XRC), the (0002) plane of the underlying layer 14a formed by the manufacturing method according to Comparative example 1 had a half width of 100 arcseconds and the (10-10) plane thereof had a half width of 600 arcseconds.

In addition, it was visually observed that the substrate 11 having the n-type contact layer 14b formed thereon had a mirror surface.

Then, the substrate 11 having the n-type contact layer 14b formed thereon was put into an MOCVD furnace, and various layers forming the semiconductor layer 20 were formed on the n-type contact layer 14b to obtain the laminated semiconductor 10 shown in FIG. 5, similar to Example 1.

Then, the laminated semiconductor 10 was used to manufacture the light-emitting device 1 shown in FIGS. 3 and 4 by the same method as that in Example 1. Then, the obtained light-emitting device 1 was used to manufacture a light-emitting diode by the same method as that in Example 1.

A forward current of 20 mA was applied between the positive electrode bonding pad 18 and the negative electrode 19 of the light-emitting diode to measure a forward voltage. As a result, the forward voltage was 3.2 V. In addition, an emission state was observed through the p-side transparent positive electrode 17. As the result, an emission wavelength was 470 nm and emission power was 14.0 mW. The emission characteristics of the light-emitting diode were obtained from substantially the entire surface of a manufactured wafer, without any variation.

However, in Comparative example 1, all of the buffer layer 12, the underlying layer 14a, and the n-type contact layer 14b were continuously formed by sputtering, and the deposition speed thereof was gradually reduced. In addition, when the chamber of the sputtering apparatus was opened to the air and the target was visually observed, both the Al target used to form the buffer layer and the Ga target used to form the contact layer and the underlying layer had cloudy surfaces. As a result of analysis, a nitride film was formed.

INDUSTRIAL APPLICABILITY

The present invention can be applied to an apparatus for manufacturing a group-III nitride semiconductor layer, a method of manufacturing a group-III nitride semiconductor layer, a group-III nitride semiconductor light-emitting device, a method of manufacturing a group-III nitride semiconductor light-emitting device, and a lamp.

The invention claimed is:
1. A method of manufacturing a group-III nitride semiconductor layer on a substrate using a sputtering method, the method comprising:

a first plasma generating step of generating a first plasma for sputtering a target including a group-III element to supply raw material particles to the substrate; and a second plasma generating step of generating a second plasma including a nitrogen element, wherein the first plasma generating step forms a film on the substrate made of the same material forming the target, including the group-III element, wherein the nitrogen element of the second plasma generating step reacts with the group-III element of the film to form a group-III nitride, and wherein the first plasma generating step and the second plasma generating step are alternately performed to alternately generate the first plasma and the second plasma in a chamber.

2. A method of manufacturing a group-III nitride semiconductor layer on a substrate by a sputtering method using a group-III nitride semiconductor layer manufacturing apparatus that includes a chamber having a first plasma region and a second plasma region separated from the first plasma region by a shielding wall, the method comprising:

a first plasma generating step of generating a first plasma for sputtering a target which is arranged in the first plasma region and includes a group-III element to supply raw material particles to the substrate in the first plasma region;

a second plasma generating step of generating a second plasma including a nitrogen element in the second plasma region;

a first moving step of moving the substrate from the first plasma region to the second plasma region after the first plasma generating step; and a second moving step of moving the substrate from the second plasma region to the first plasma region after the second plasma generating step, thereby alternately supplying the raw material particles and the nitrogen element onto the substrate.

3. The method of manufacturing a group-III nitride semiconductor layer according to claim 1,
wherein the target includes Al or Ga.

4. The method of manufacturing a group-III nitride semiconductor layer according to claim 1,
wherein the first plasma generating step forms a film having a thickness in the range of 0.2 nm to 2 nm.

5. The method of manufacturing a group-III nitride semiconductor layer according to claim 1,
wherein the first plasma generating step forms a thin film having a thickness corresponding to one atomic layer.

6. A method of manufacturing a group-III nitride semiconductor light-emitting device including a semiconductor layer, which is a laminate of an n-type semiconductor layer, a light-emitting layer, and a p-type semiconductor layer made of group-III nitride semiconductors, formed on a substrate, the method comprising:
forming at least a portion of the semiconductor layer using the method of manufacturing a group-III nitride semiconductor layer according to claim 1.

7. A method of manufacturing a group-III nitride semiconductor light-emitting device including a semiconductor layer, which is a laminate of an n-type semiconductor layer, a light-emitting layer, and a p-type semiconductor layer made of group-III nitride semiconductors, formed on a substrate and a buffer layer that is made of a group-III nitride semiconductor and is interposed between the substrate and the n-type semiconductor layer, the method comprising:
forming the buffer layer using the method of manufacturing a group-III nitride semiconductor layer according to claim 1.

8. The method of manufacturing a group-III nitride semiconductor layer according to claim 2,
wherein the target includes Al or Ga.

9. The method of manufacturing a group-III nitride semiconductor layer according to claim 2,
wherein the first plasma generating step forms a film having a thickness in the range of 0.2 nm to 2 nm.

10. The method of manufacturing a group-III nitride semiconductor layer according to claim 2,
wherein the first plasma generating step forms a thin film having a thickness corresponding to one atomic layer.

11. A method of manufacturing a group-III nitride semiconductor light-emitting device including a semiconductor layer, which is a laminate of an n-type semiconductor layer, a light-emitting layer, and a p-type semiconductor layer made of group-III nitride semiconductors, formed on a substrate, the method comprising:
forming at least a portion of the semiconductor layer using the method of manufacturing a group-III nitride semiconductor layer according to claim 2.

12. A method of manufacturing a group-III nitride semiconductor light-emitting device including a semiconductor layer, which is a laminate of an n-type semiconductor layer, a light-emitting layer, and a p-type semiconductor layer made of group-III nitride semiconductors, formed on a substrate and a buffer layer that is made of a group-III nitride semiconductor and is interposed between the substrate and the n-type semiconductor layer, the method comprising:
forming the buffer layer using the method of manufacturing a group-III nitride semiconductor layer according to claim 2.

* * * * *